(12) United States Patent
Yonemaru et al.

(10) Patent No.: US 8,384,461 B2
(45) Date of Patent: Feb. 26, 2013

(54) SHIFT REGISTER AND DISPLAY DEVICE

(75) Inventors: Masashi Yonemaru, Osaka (JP);
Masahiko Nakamizo, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/376,767

(22) PCT Filed: Feb. 22, 2010

(86) PCT No.: PCT/JP2010/001129
§ 371 (c)(1),
(2), (4) Date: Dec. 7, 2011

(87) PCT Pub. No.: WO2010/146738
PCT Pub. Date: Dec. 23, 2010

(65) Prior Publication Data
US 2012/0076256 A1    Mar. 29, 2012

(30) Foreign Application Priority Data
Jun. 15, 2009  (JP) .................... 2009-142555

(51) Int. Cl.
H03K 23/00  (2006.01)
(52) U.S. Cl. ........................................ 327/241
(58) Field of Classification Search .......... None
See application file for complete search history.

(56) References Cited

U.S. PATENT DOCUMENTS

| | | |
|---|---|---|
| 5,646,642 A | 7/1997 | Maekawa et al. |
| 5,748,026 A | 5/1998 | Maekawa et al. |
| 6,081,131 A * | 6/2000 | Ishii ............................ 326/68 |
| 6,426,743 B1 | 7/2002 | Yeo et al. |
| 6,556,646 B1 | 4/2003 | Yeo et al. |
| 6,876,353 B2 | 4/2005 | Morosawa et al. |
| 6,943,606 B2 * | 9/2005 | Dunning et al. ............ 327/231 |
| 7,460,634 B2 | 12/2008 | Deane |
| 7,486,269 B2 | 2/2009 | Moon |
| 2003/0002615 A1 | 1/2003 | Morosawa et al. |
| 2005/0008114 A1 | 1/2005 | Moon |
| 2006/0132182 A1 | 6/2006 | Kikuchi |
| 2007/0248205 A1 | 10/2007 | Deane |

FOREIGN PATENT DOCUMENTS

| | | |
|---|---|---|
| JP | 6216753 A | 8/1994 |
| JP | 2000155550 A | 6/2000 |
| JP | 2003016794 A | 1/2003 |
| JP | 2003346492 A | 12/2003 |
| JP | 2005050502 A | 2/2005 |
| JP | 2006106320 A | 4/2006 |

(Continued)

OTHER PUBLICATIONS

International Search Report and Written Opinion of Searching Authority.

*Primary Examiner* — Lincoln Donovan
*Assistant Examiner* — Sibin Chen
(74) *Attorney, Agent, or Firm* — Harness, Dickey & Pierce, P.L.C.

(57) ABSTRACT

Disclosed are a shift register and a display device which can suppress noise of output of each stage without causing an increase in circuit scale. In at least one example embodiment, each stage of the shift register includes a first output transistor, a second output transistor, a first capacitor, a second capacitor, an input gate, a first switching element, a second switching element, a third switching element, a fourth switching element, and a fifth switching element.

8 Claims, 12 Drawing Sheets

FOREIGN PATENT DOCUMENTS

| | | |
|---|---|---|
| JP | 2006178165 A | 7/2006 |
| JP | 2008508654 A | 3/2008 |
| JP | 2008287134 A | 11/2008 |
| WO | WO-2010097986 A1 | 9/2010 |

* cited by examiner

F I G. 6
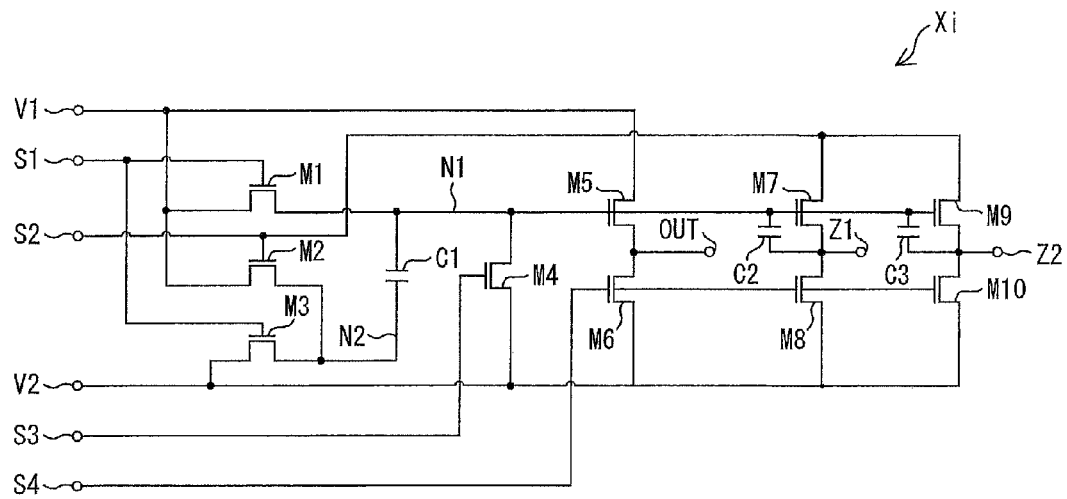
F I G. 7
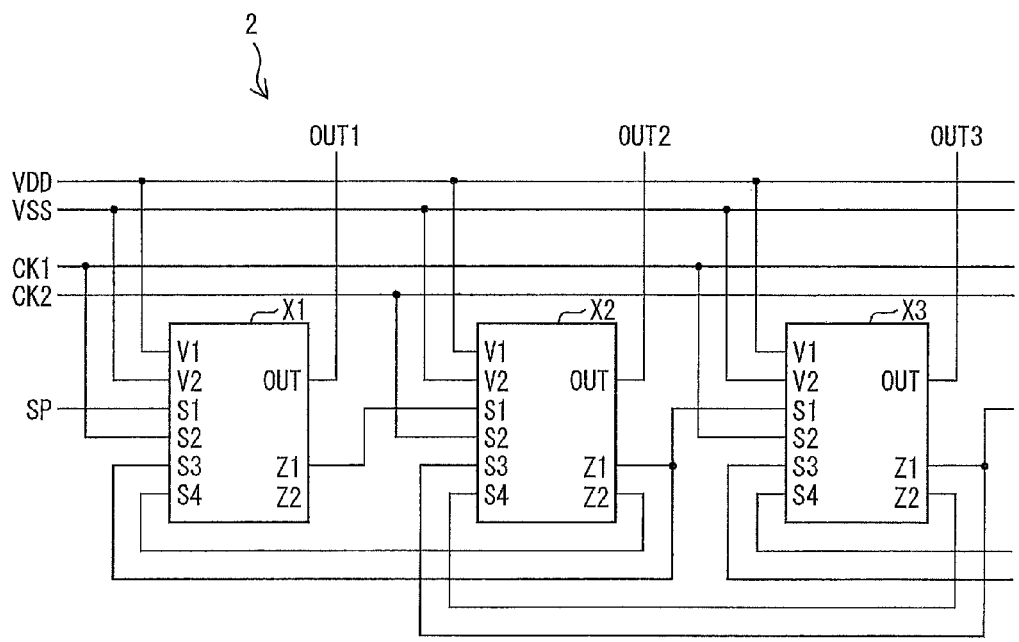

(a)

(b)

F I G. 1 5
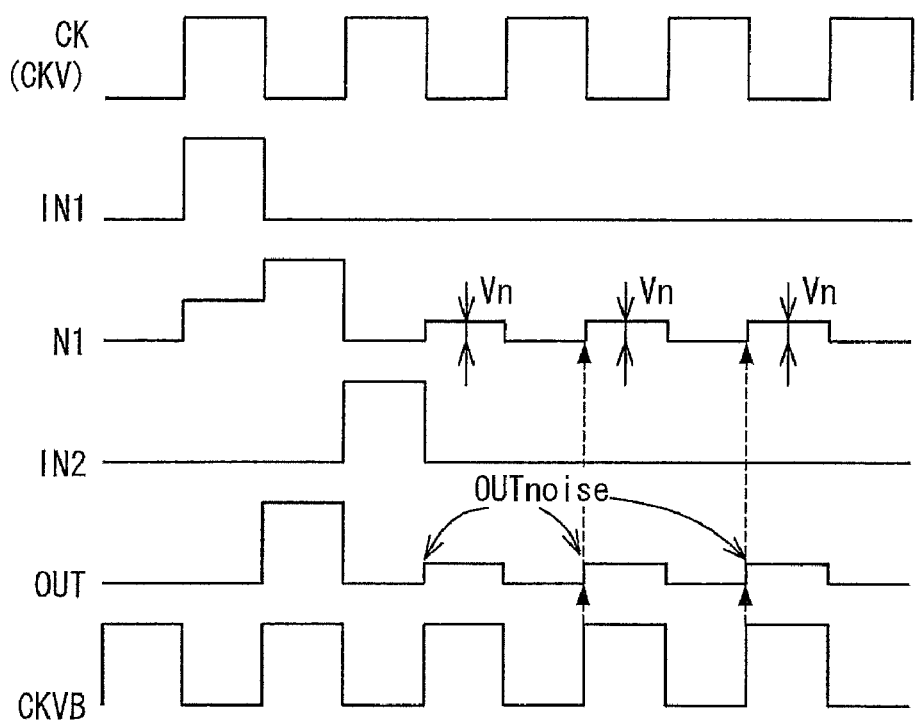

F I G. 1 6
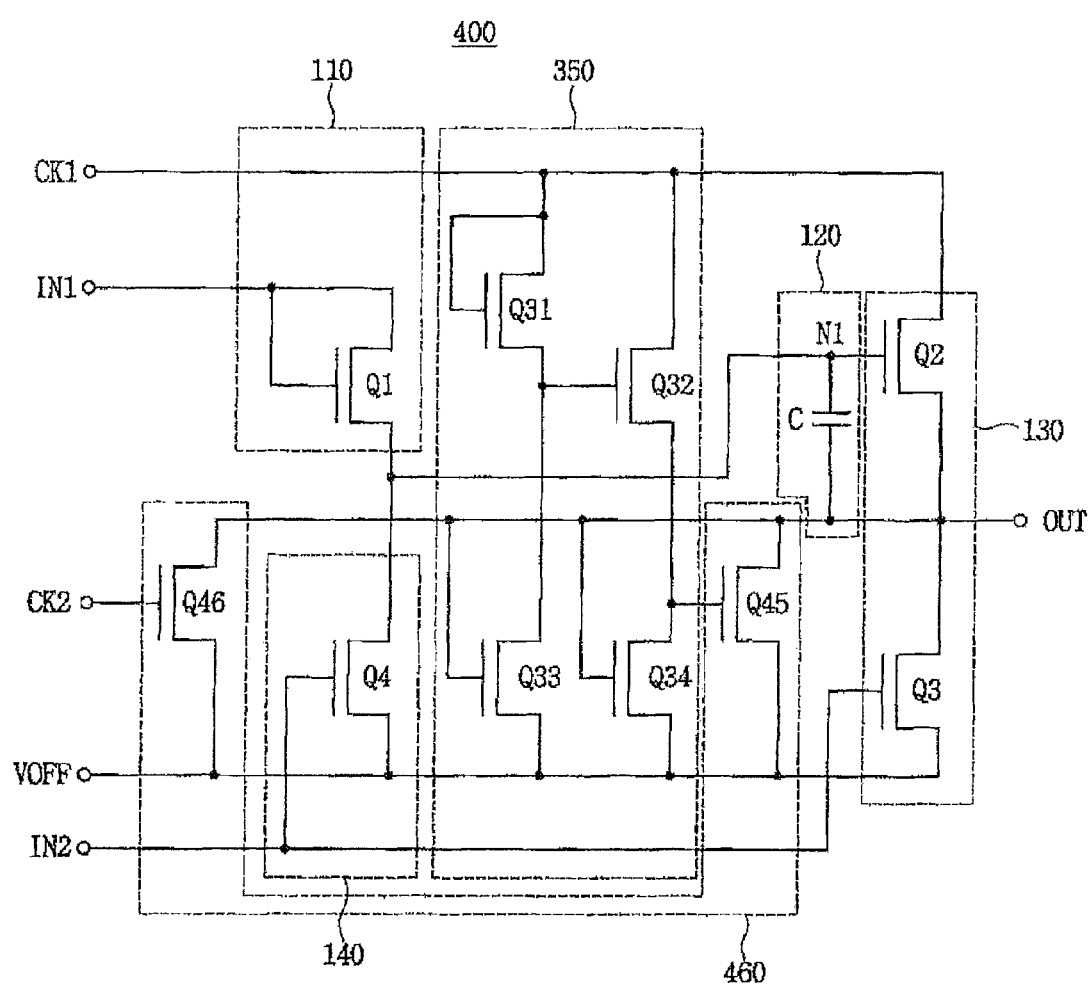

SHIFT REGISTER AND DISPLAY DEVICE

TECHNICAL FIELD

The present invention relates to a shift register for use in a gate driver of a display panel etc.

BACKGROUND ART

In recent years, the fabrication of a monolithic gate driver has been developed for the purpose of cost reduction. The monolithic gate driver is such a gate driver that is formed from amorphous silicon on a liquid crystal panel. The term "monolithic gate driver" is also associated with the terms such as "gate driver-free", "built-in gate driver in panel", and "gate in panel".

FIG. 12 illustrates a configuration of such a gate driver (scan driving circuit) disclosed in Patent Literature 1.

The gate driver is configured such that a plurality of unit stages SRC11, SRC12, ... SRC1N, and SRC1D are cascaded with each other. To a clock terminal CK of each odd-numbered unit stage, a first clock CKV is supplied, and to a clock terminal CK of each even-numbered unit stage, a second clock CKVB is supplied. The first clock CKV and the second clock CKVB have opposite phases. From an output terminal OUT, a gate signal (G1, G2, ... GN, GD) is supplied to a gate bus line.

To a first input terminal IN1 of the first unit stage SRC11, a scan start signal STV is supplied, and to respective first input terminals IN1 of the succeeding stages (SRC12, SRC13, ... SRC1N, and SRC1D), gate signals outputted from their preceding stages are supplied. To respective second input terminals IN2 of the unit stage SRC11, SRC12, ... and SRC1N, gate signals outputted from their subsequent unit stages are supplied. Each of the unit stages includes a first voltage terminal VOFF.

CITATION LIST

Patent Literature 1
Japanese Patent Application Publication, Tokukai, No. 2005-50502 A (Publication Date: Feb. 24, 2005)
Patent Literature 2
Japanese Patent Application Publication, Tokukai, No. 2000-155550 A (Publication Date: Jun. 6, 2000)
Patent Literature 3
Japanese Patent Application Publication, Tokukai, No. 2003-016794 A (Publication Date: Jan. 17, 2003)
Patent Literature 4
Japanese Patent Application Publication, Tokukaihei, No. 6-216753 A (Publication Date: Aug. 5, 1994)
Patent Literature 5
Japanese Patent Application Publication, Tokukai, No. 2003-346492 A (Publication Date: Dec. 5, 2003)
Patent Literature 6
Translation of PCT Application, Tokuhyo, No. 2008-508654 A (Publication Date: Mar. 21, 2008)

SUMMARY OF INVENTION

Technical Problem

Patent Literature 1 discloses a circuit configuration of a unit stage 100 (see FIG. 13) as each of the unit stages SRC11, SRC12, ... SRC1N, and SRC1D. The unit stage 100 includes a buffer section 110, a charging section 120, a driving section 130, a discharging section 140, and a holding section 150.

The following describes an operation of this circuit on the assumption that a first clock CKV or a second clock CKVB of FIG. 14 set by the applicant of the present application is supplied to the unit stage 100. Specifically, in a case where the unit stage 100 is an odd-numbered stage, the first clock CKV of FIG. 14 is supplied to a clock terminal CK, whereas in a case where the unit stage 100 is an even-numbered stage, the second clock CKVB of FIG. 14 is supplied to the clock terminal CK. The first clock CKV and the second clock CKVB have opposite phases.

The following description deals with an example in which the unit stage 100 is an even-numbered stage.

As shown in FIG. 14, when a gate pulse is supplied from a preceding unit stage 100 to a first input terminal IN1, i.e., a gate and a drain of a transistor Q1 of the buffer section 110, the transistor Q1 is turned ON, which charges a capacitor C of the charging section 120. This causes a transistor Q2 of the driving section 130 to be turned ON. Then, the gate pulse supplied from the preceding unit stage 100 to the first input terminal IN1 falls to a Low level, which causes the transistor Q1 to be turned OFF. Subsequently, when a High level electric potential of the second clock CKVB is supplied to a drain of the transistor Q2, an electric potential of a node N1 is pushed up due to a bootstrap effect of the capacitor C. This sufficiently reduces a channel resistance of the transistor Q2. As a result, a gate pulse having almost the same amplitude as the clock signal is outputted from an output terminal OUT.

This gate pulse is supplied to a unit stage 100 in a next stage, and the unit stage 100 in the next stage outputs a gate pulse. The gate pulse thus outputted from the unit stage 100 in the next stage is supplied to a second input terminal IN2 of the unit stage 100 in the present stage. This causes a transistor Q3 of the driving section 130 and a transistor Q4 of the discharging section 140 to be turned ON. Consequently, the output terminal OUT, a gate bus line, and the node N1 are connected to a first voltage terminal VOFF and are reset to a Low level.

During operation of the other unit stages 100, the transistor Q5 of the holding section 150 is turned ON every time the second clock CKVB supplied to the clock terminal CK becomes a High level, so that the node N1 is periodically connected to the output terminal OUT.

An odd-numbered unit stage 100 operates in a similar manner at timings different from those of FIG. 14 by 1 clock pulse.

According to this monolithic gate circuit configuration, even if only n-channel type TFTs are used, a channel resistance of an output transistor such as the transistor Q2 can be sufficiently reduced due to a bootstrap effect, thereby increasing a driving capability. This produces the following advantage. Specifically, even in a case where a gate driver formed from an material, such as amorphous silicon, with which only n-channel TFTs can be produced, is monolithically built into a panel, it is possible to sufficiently overcome disadvantageous characteristics of amorphous silicon TFTs such as a high threshold voltage and low electron mobility and to meet a demand for a reduction in voltage of a panel.

However, a conventional monolithic gate circuit has the following problem. That is, since an output transistor represented by the transistor Q2 of FIG. 13 has a gate/drain parasitic capacitor (hereinafter referred to as a drain parasitic capacitor) and a gate/source parasitic capacitor (hereinafter referred to as a source parasitic capacitor), distortion occurs in a gate output waveform.

To the drain of the transistor Q2, a voltage of the clock supplied from the clock terminal CK is always applied. Accordingly, even during a period in which the transistor Q2 should be turned OFF, fluctuation DN of an electric potential of the node N1 occurs through the drain parasitic capacitor due to a so-called feed-through phenomenon every time the clock rises, as shown in FIG. 4. This causes leakage in the transistor Q2. In a case where leakage occurs in the transistor Q2, a leaked signal LO is outputted from the output terminal OUT during a period in which the gate output should be in an OFF state, as shown in FIG. 14.

Further, in a case where the fluctuation DN of the electric potential of the node N1 occurs through the drain parasitic capacitor due to a so-called feed-through phenomenon to such an extent that the electric potential of the node N1 exceeds the threshold electric potential of the transistor Q2, the transistor Q2 is turned ON. Accordingly, the clock leaks into the source of the transistor Q2, and the source output pushes up the electric potential of the node N1 through the capacitor C. Consequently, the electric potential of the node N1 increased by Vn during a period of a clock pulse, and a pulse OUTnoise which rises with a pulse width equal to the period of the clock pulse is supplied to the output terminal OUT.

During a period in which the gate pulse should be supplied to the output terminal OUT, the fluctuation DN of the electric potential of the node N1 which occurs through the drain parasitic capacitor has an effect of increasing driving capability of the transistor Q2. This is because the fluctuation DN of the electric potential of the node N1 reduces the channel resistance of the transistor Q2 and increases an electric current. However, since the gate pulse is supposed to be supplied to the output terminal OUT only once in a single frame, the fluctuation DN of the electric potential of the node N1 becomes noise during a period other than the gate pulse output period. For example, in a panel of WXGA resolution which has 768 gate bus lines, the pushing up of the electric potential of the node N1 becomes noise during (i) periods corresponding to 767 clocks other than a period in which each stage outputs a gate pulse to a corresponding gate bus line and (ii) a vertical blanking period provided at a boundary between frames which is defined by a vertical sync signal Vsync.

The source parasitic capacitor has an effect of pushing up the electric potential of the node N1 at the time of output of the gate pulse, and therefore works to increase the driving capability of the transistor Q2. Although this effect can be obtained to a certain degree only by the source parasitic capacitor, this function is positively increased in FIG. 13 in which a bootstrap capacitor represented by the capacitor C provided by the transistor Q2 is combined in parallel with the source parasitic capacitor. However, in a case where this method is employed, the boot effect is not produced until the electric potential of the output terminal OUT completely rises. That is, this method is disadvantageous in that rising TR of the gate pulse is delayed. The delay of the rising TR causes distortion of the waveform of the gate pulse.

As described above, the stage configuration of FIG. 13 has the problem that noise occurs in stage output. Further, since each stage output is supplied to a succeeding stage, the noise spreads to subsequent stages in a chain reaction manner, and this may cause malfunction of a shift register.

In view of this, Patent Literature 1 discloses another stage configuration (see FIG. 16) for preventing accumulation and spread of noise of stage output by adding circuits.

In FIG. 16, transistors Q45 and Q46 are provided so that an output terminal OUT and a gate bus line are connected to a first voltage terminal VOFF every time a clock rises during periods other than the gate pulse output period. Thus, the output terminal OUT and the gate bus line maintain a Low level. In this case, a control circuit constituted by transistors Q31 through Q34 is provided in order that the transistor Q45 functions. Further, a unit stage 400 has two clock terminals, i.e., a first clock terminal CK1 and a second clock terminal CK2 in order that a period of connection to the first voltage terminal VOFF is prolonged. To the first clock terminal CK1 and the second clock terminal CK2, respective clocks having opposite phase are supplied so that the transistor Q45 and the transistor Q46 are alternately turned ON.

However, the configuration of FIG. 16 necessitates addition of a circuit as described above. This causes an increase in the number of elements in a circuit and an increase in area of the circuit, and therefore is not preferable.

The present invention was attained in view of the above conventional problems, and an object of the present invention is to provide a shift register and a display device each of which can suppress noise of each stage output well without causing an increase in circuit scale.

Solution to Problem

In order to attain the above object, a shift register of the present invention includes one or more cascade connection circuits in each of which stages are cascaded with each other so that a shift pulse is transmitted, at least one of the one or more cascade connection circuits including, among all stages thereof, a successive stage group constituted by successive stages, each stage of the successive stage group including:

a first output transistor having a drain to which a first direct current voltage is applied and a source serving as a first output terminal which is an output terminal of said each stage;

a second output transistor having (i) a drain to which a first clock signal corresponding to said each stage is supplied, the first clock signal having an active clock pulse period which does not overlap a period of a shift pulse for said each stage, and (ii) a source serving as a second output terminal which is an output terminal of said each stage and which is different from the first output terminal;

a first capacitor having one end connected to a gate of the first output transistor and a gate of the second output transistor;

a second capacitor having one end connected to the one end of the first capacitor and other end connected to the second output terminal;

an input gate to which the shift pulse for said each stage is supplied and through which an electric potential to be supplied to the one end of the first capacitor passes during a pulse period of the shift pulse for said each stage;

a first switching element having one end connected to the other end of the first capacitor, the other end to which the first direct current voltage is applied, and a conduction/shutoff control terminal to which the first clock signal is supplied;

a second switching element having one end connected to the other end of the first capacitor, the other end to which a second direct current voltage lower than the first direct current voltage is applied, and a conduction/shutoff control terminal to which the shift pulse for said each stage is supplied;

a third switching element having one end connected to the one end of the first capacitor, the other end to which the second direct current voltage is applied, and a conduction/shutoff control terminal to which a pulse signal whose phase lags behind a phase of a shift pulse outputted from the second output terminal of said each stage is supplied;

a fourth switching element having one end connected to the first output terminal, the other end to which the second direct current voltage is applied, and a conduction/shutoff control terminal (i) to which, in a case where said each stage is not a final stage of the successive stage group, a shift pulse outputted from the second output terminal of a succeeding stage is supplied and (ii) to which, in a case where said each stage is the final stage of the successive stage group, a pulse signal whose phase lags behind a phase of a shift pulse outputted from the second output terminal of the final stage is supplied; and a fifth switching element having one end connected to the second output terminal, the other end to which the second direct current voltage is applied, and a conduction/shutoff control terminal connected to the conduction/shutoff control terminal of the fourth switching element.

According to the invention, the first direct current voltage is applied to the drain of the first output transistor, and a switched capacitor operation is carried out with the use of the first switching element, the second switching element, and the first capacitor. This makes it possible to prevent a feedthrough phenomenon from occurring through a drain parasitic capacitor and a source parasitic capacitor of the first output transistor. It is therefore possible to prevent (i) output voltage fluctuation which occurs in a case where a clock signal is supplied to the drain of the first output transistor and (ii) charge leakage from a picture element electrode which occurs due to the output voltage fluctuation. This eliminates the need for addition of a circuit for frequently connecting the first output terminal of the stage to a Low power supply.

As a result, it is possible to provide a shift register which can suppress noise of each stage output well without causing an increase in circuit scale.

Further, it is possible to prevent a situation in which an electric potential of one end of the first capacitor is pushed up due to capacitive coupling so that an output of the second output terminal rises during an undesired period, thereby preventing malfunction of the shift register. Further, it is possible to reduce the number of required external input signals to be supplied to the shift register.

Since the second output transistor is used to output a shift pulse to be transmitted through the stages, the size of the second output transistor can be made much smaller than that of the first output transistor which is used for output to an outside of the shift register. Accordingly, the drain parasitic capacitor of the second output transistor is sufficiently small as compared with the drain parasitic capacitor and the source parasitic capacitor of the first output transistor and with the first capacitor. Consequently, even if the first clock signal is supplied to the drain of the second output transistor, an influence of pushing up of the electric potential of one end of the first capacitor by capacitive coupling can be ignored.

Further, since load driven by the second output terminal is sufficiently smaller than load driven by the first output terminal, a change amount of a load on an external level shifter which generates a control signal for the shift register can be ignored.

Further, since both of the load connected to the first output terminal and the load connected to the second output terminal are driven to be boosted by the first capacitor and the second capacitor that is provided between one end of the first capacitor and the second output terminal, the total capacitance value of the first capacitor and the second capacitor can be made equal to or smaller than a value of the first capacitor obtained in a case where the second capacitor is not provided, and sizes of the input gate, the first switching element, the second switching element, and the third switching element can be made smaller than those obtained in a case where the second capacitor is not provided. Accordingly, it is possible to reduce a total area of a circuit using the shift register as compared with a case where the second capacitor is not provided. Further, it is possible to reduce proportion of transistors, especially TFTs to the shift register.

Further, since the area of the circuit using the shift register is reduced, it is possible to reduce a size and a cost of a display panel using the circuit as a driver. The reduction in capacitance value and sizes of elements such as transistors leads to suppression of a reduction in yield caused by detects, thereby contributing to improvement in yield of a display panel and a reduction in cost of the display panel.

Further, since the direct current voltage is applied to the drain of the first output transistor, a gate bus line can be driven by a direct current power supply. This makes it possible to greatly reduce a load on an external level shifter which generates a control signal for the shift register as compared with a case where a clock signal is supplied to the drain of the first output transistor so that a gate bus line is driven by the clock signal.

Further, since the direct current voltage is applied to the drain of the first output transistor, a period of time in which a negative bias is applied between the gate and the drain of the first output transistor is prolonged. This allows a reduction in rise of a threshold voltage, thereby preventing degradation of performance of the shift register.

In order to attain the above object, a shift register of the present invention includes one or more cascade connection circuits in each of which stages are cascaded with each other so that a shift pulse is transmitted, at least one of the one or more cascade connection circuits including, among all stages thereof, a successive stage group constituted by successive stages, each stage of the successive stage group including:

a first output transistor having a drain to which a first direct current voltage is applied and a source serving as a first output terminal which is an output terminal of said each stage;

a second output transistor having (i) a drain to which a first clock signal corresponding to said each stage is supplied, the first clock signal having an active clock pulse period which does not overlap a period of a shift pulse for said each stage, and (ii) a source serving as a second output terminal which is an output terminal of said each stage and which is different from the first output terminal;

a third output transistor having a drain to which the first clock signal is supplied and a source serving as a third output terminal which is an output terminal of said each stage and which is different from the first output terminal and the second output terminal;

a first capacitor having one end connected to a gate of the first output transistor, a gate of the second output transistor, and the third output transistor;

a second capacitor having one end connected to the one end of the first capacitor and other end connected to the second output terminal;

a second capacitor having one end connected to the one end of the first capacitor and having the other end connected to the third output terminal;

an input gate to which the shift pulse for said each stage is supplied and through which an electric potential to be supplied to the one end of the first capacitor passes during a pulse period of the shift pulse for said each stage;

a first switching element having one end connected to the other end of the first capacitor, the other end to which the first direct current voltage is applied, and a conduction/shutoff control terminal to which the first clock signal is supplied;

a second switching element having one end connected to the other end of the first capacitor, the other end to which a second direct current voltage lower than the first direct current voltage is applied, and a conduction/shutoff control terminal to which the shift pulse for said each stage is supplied;

a third switching element having one end connected to the one end of the first capacitor, the other end to which the second direct current voltage is applied, and a conduction/shutoff control terminal to which a first pulse signal whose phase lags behind a phase of a shift pulse outputted from the second output terminal of said each stage is supplied;

a fourth switching element having one end connected to the first output terminal, the other end to which the second direct current voltage is applied, and a conduction/shutoff control terminal to which a second pulse signal whose phase lags behind the phase of the shift pulse outputted from the second output terminal of said each stage is supplied; and a fifth switching element having one end connected to the second output terminal, the other end to which the second direct current voltage is applied, and a conduction/shutoff control terminal connected to the conduction/shutoff control terminal of the fourth switching element, a signal outputted from the second output terminal of each of the stages of the successive stage group except a first stage being used as a shift pulse and the first pulse signal for a preceding stage, and a signal outputted from the third output terminal of each of the stages of the successive stage group except the first stage being used as the second pulse signal for the preceding stage.

According to the invention, the first direct current voltage is applied to the drain of the first output transistor, and a switched capacitor operation is carried out with the use of the first switching element, the second switching element, and the first capacitor. This makes it possible to prevent a feedthrough phenomenon from occurring through a drain parasitic capacitor and a source parasitic capacitor of the first output transistor. It is therefore possible to prevent (i) output voltage fluctuation which occurs in a case where a clock signal is supplied to the drain of the first output transistor and (ii) charge leakage from a picture element electrode which occurs due to the output voltage fluctuation. This eliminates the need for addition of a circuit for frequently connecting the first output terminal of the stage to a Low power supply.

As a result, it is possible to provide a shift register which can suppress noise of each stage output well without causing an increase in circuit scale.

Further, it is possible to prevent a situation in which an electric potential of one end of the first capacitor is pushed up due to capacitive coupling so that an output of the second output terminal rises during an undesired period, thereby preventing malfunction of the shift register. Further, it is possible to reduce the number of required external input signals to be supplied to the shift register.

Since the second output transistor is used to output a shift pulse to be transmitted through the stages, the size of the second output transistor can be made much smaller than that of the first output transistor which is used for output to an outside of the shift register. Accordingly, the drain parasitic capacitor of the second output transistor is sufficiently small as compared with the drain parasitic capacitor and the source parasitic capacitor of the first output transistor and with the first capacitor. Consequently, even if the first clock signal is supplied to the drain of the second output transistor, an influence of pushing up of the electric potential of one end of the first capacitor by capacitive coupling can be ignored.

Further, since load driven by the second output terminal is sufficiently smaller than load driven by the first output terminal, a change amount of a load on an external level shifter which generates a control signal for the shift register can be ignored.

Further, a section which outputs a shift pulse to be supplied to another stage and a reset signal for one end of the first capacitor from the second output transistor via the second output terminal and a section which outputs a reset signal for an output terminal of another stage from the third output transistor via the third output terminal are provided separately from each other so as to drive respective loads. This makes it possible to prevent interference between (i) the shift pulse to be supplied to another stage and the reset signal for one end of the first capacitor and (ii) the reset signal for an output terminal of another stage.

Further, since all of the load connected to the first output terminal, the load connected to the second output terminal, and the load connected to the third output terminal are driven to be boosted by the first capacitor, the second capacitor that is provided between one end of the first capacitor and the second output terminal, and the third capacitor provided between the one end of the first capacitor and the third output terminal, the total capacitance value of the first capacitor, the second capacitor, and the third capacitor can be made equal to or smaller than a value of the first capacitor obtained in a case where the second capacitor and the third capacitor are not provided or can be made equal to or smaller than the total capacitance value of the first capacitor and the second capacitor obtained in a case where the third capacitor is not provided. Accordingly, sizes of the input gate, the first switching element, the second switching element, and the third switching element can be made smaller than those obtained in a case where the second capacitor and the third capacitor are not provided and those obtained in a case where the third capacitor is not provided. Consequently, it is possible to reduce a total area of a circuit using the shift register as compared with a case where the second capacitor and the third capacitor are not provided and a case where the third capacitor is not provided. Further, it is possible to reduce proportion of transistors, especially TFTs to the shift register.

Further, since the area of the circuit using the shift register is reduced, it is possible to reduce a size and a cost of a display panel using the circuit as a driver. The reduction in capacitance value and sizes of elements such as transistors leads to suppression of a reduction in yield caused by detects, thereby contributing to improvement in yield of a display panel and a reduction in cost of the display panel.

Further, since the direct current voltage is applied to the drain of the first output transistor, a gate bus line can be driven by a direct current power supply. This makes it possible to greatly reduce a load on an external level shifter which generates a control signal for the shift register as compared with a case where a clock signal is supplied to the drain of the first output transistor so that a gate bus line is driven by the clock signal.

Further, since the direct current voltage is applied to the drain of the first output transistor, a period of time in which a negative bias is applied between the gate and the drain of the first output transistor is prolonged. This allows a reduction in rise of a threshold voltage, thereby preventing degradation of performance of the shift register.

Advantageous Effects of Invention

As described above, the shift register of the present invention includes one or more cascade connection circuits in each of which stages are cascaded with each other so that a shift pulse is transmitted, at least one of the one or more cascade connection circuits including, among all stages thereof, a successive stage group constituted by successive stages, each stage of the successive stage group including:

a first output transistor having a drain to which a first direct current voltage is applied and a source serving as a first output terminal which is an output terminal of said each stage;

a second output transistor having (i) a drain to which a first clock signal corresponding to said each stage is supplied, the first clock signal having an active clock pulse period which does not overlap a period of a shift pulse for said each stage, and (ii) a source serving as a second output terminal which is an output terminal of said each stage and which is different from the first output terminal;

a first capacitor having one end connected to a gate of the first output transistor and a gate of the second output transistor;

a second capacitor having one end connected to the one end of the first capacitor and other end connected to the second output terminal;

an input gate to which the shift pulse for said each stage is supplied and through which an electric potential to be supplied to the one end of the first capacitor passes during a pulse period of the shift pulse for said each stage;

a first switching element having one end connected to the other end of the first capacitor, the other end to which the first direct current voltage is applied, and a conduction/shutoff control terminal to which the first clock signal is supplied;

a second switching element having one end connected to the other end of the first capacitor, the other end to which a second direct current voltage lower than the first direct current voltage is applied, and a conduction/shutoff control terminal to which the shift pulse for said each stage is supplied;

a third switching element having one end connected to the one end of the first capacitor, the other end to which the second direct current voltage is applied, and a conduction/shutoff control terminal to which a pulse signal whose phase lags behind a phase of a shift pulse outputted from the second output terminal of said each stage is supplied;

a fourth switching element having one end connected to the first output terminal, the other end to which the second direct current voltage is applied, and a conduction/shutoff control terminal (i) to which, in a case where said each stage is not a final stage of the successive stage group, a shift pulse outputted from the second output terminal of a succeeding stage is supplied and (ii) to which, in a case where said each stage is the final stage of the successive stage group, a pulse signal whose phase lags behind a phase of a shift pulse outputted from the second output terminal of the final stage is supplied; and a fifth switching element having one end connected to the second output terminal, the other end to which the second direct current voltage is applied, and a conduction/shutoff control terminal connected to the conduction/shutoff control terminal of the fourth switching element.

It is therefore possible to provide a shift register which can suppress noise of each stage output well without causing an increase in circuit scale.

Further, it is possible to reduce a total area of a circuit using the shift register as compared with a case where the second capacitor is not provided. Further, it is possible to reduce proportion of transistors, especially TFTs to the shift register.

BRIEF DESCRIPTION OF DRAWINGS

FIG. 1 shows an embodiment of the present invention and is a circuit diagram illustrating a configuration of a stage of a shift register of Example 1.

FIG. 2 is a block diagram illustrating a configuration of the shift register of Example 1.

FIG. 3 is a waveform diagram showing an operation of the shift register of Example 1.

FIG. 4 is a waveform diagram comparing a waveform of an output electric potential of the shift register of Example 1 and a waveform obtained before improvement.

FIG. 5 is a waveform diagram comparing a waveform of an electric potential of one end of a first capacitor of the shift register of Example 1 and a waveform obtained before improvement.

FIG. 6

FIG. 6 shows an embodiment of the present invention and is a block diagram illustrating a configuration of a shift register of Example 2.

FIG. 7

FIG. 7 is a block diagram illustrating the configuration of the shift register of Example 2.

FIG. 8 shows an embodiment of the present invention, and is a block diagram illustrating a configuration of a display device.

FIG. 9 shows an embodiment of the present invention, and is a circuit diagram illustrating a form of a capacitor, (a) of FIG. 9 is a circuit diagram illustrating a first form of the capacitor, and (b) of FIG. 9 is a circuit diagram illustrating a second form of the capacitor.

FIG. 10 is a circuit diagram illustrating a configuration of a stage of a shift register having a configuration of Comparative Example of an embodiment of the present invention.

FIG. 11 shows a conventional art, and is a circuit diagram illustrating an exemplary configuration of a stage of a first shift register.

FIG. 12 shows a conventional art, and is a block diagram illustrating a configuration of a second shift register.

FIG. 13 shows a conventional art, and is a circuit diagram illustrating a first exemplary configuration of a stage of a second shift register.

FIG. 14 is a first waveform diagram explaining problems of a conventional shift register.

FIG. 15

FIG. 15 is a second waveform diagram explaining problems of a conventional shift register.

FIG. 16

FIG. 16 shows a conventional art, and is a circuit diagram illustrating a second exemplary configuration of a stage of a second shift register.

DESCRIPTION OF EMBODIMENTS

An embodiment of the present invention is described below with reference to FIGS. 1 through 11.

Figure 8:
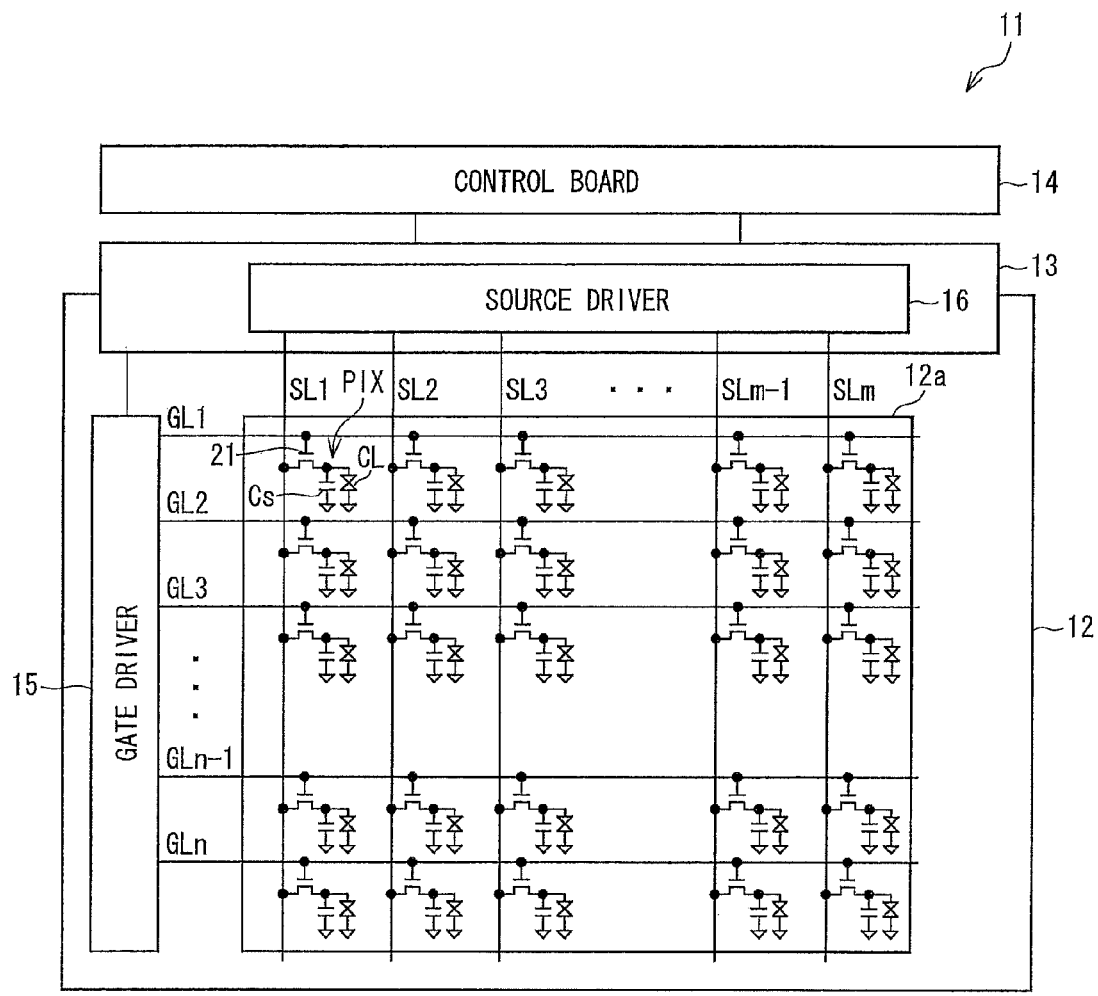
FIG. 8

FIG. 8 illustrates a configuration of a liquid crystal display device 11 which is a display device of the present embodiment.

The liquid crystal display device 11 includes a display panel 12, a flexible printed circuit board 13, and a control board 14.

The display panel 12 is an active matrix display panel arranged such that, using amorphous silicon, a display region 12a, a plurality of gate bus lines (scanning signal lines) GL, a plurality of source bus lines (data signal lines) SL, and a gate driver (scanning signal line driving circuit) 15 are built onto a glass substrate. The display panel 12 may be produced by using polycrystalline silicon, CG silicon, microcrystalline silicon, or the like silicon. The display region 12a is a region where a plurality of pixels PIX are arranged in a matrix manner. Each of the pixels PIX includes a TFT 21 that is a selection element of a pixel, a liquid crystal capacitor CL, and an auxiliary capacitor Cs. A gate of the TFT 21 is connected to the gate bus line GL, and a source of the TFT 21 is connected to the source bus line SL. The liquid crystal capacitor CL and auxiliary capacitor Cs are connected to a drain of the TFT 21.

The plurality of gate bus lines GL are gate bus lines GL1, GL2, GL3, ... and GLn, and are connected to respective outputs of the gate driver (scanning signal line driving circuit) 15. The plurality of source bus lines SL are source bus lines SL1, SL2, SL3, SLm, which are connected to respective outputs of a source driver 16 that will be described later. Although not shown, an auxiliary capacitor line is formed to apply an auxiliary capacitor voltage to each of the auxiliary capacitors Cs of the pixels PIX.

The gate driver 15 is provided in one of two regions adjoining the display region 12a of the display panel 12 in a direction in which the gate bus lines GL extend, and sequentially supplies a gate pulse (scan pulse) to each of the gate bus lines GL. Another gate driver may be provided in the other region adjoining the display region 12a of the display panel 12 in the direction in which the gate bus lines GL extend, and scan a different group of gate bus lines GL from that scanned by the gate driver 15. Alternatively, a gate driver which is provided in one of two regions adjoining the display region 12a of the display panel 12 in a direction in which the gate bus lines GL extend and a gate driver which is provided in the other one of the two regions adjoining the display region 12a of the display panel 12 may scan the same gate bus lines GL. These gate drivers are built into the display panel 12 so as to be monolithically fabricated with the display region 12a. Examples of the gate drivers can include all gate drivers referred to with the terms such as "monolithic gate driver", "gate driver-free", "built-in gate driver in panel", and "gate in panel".

The flexible printed circuit board 13 includes the source driver 16. The source driver 16 supplies a data signal to each of the source bus lines SL. The source driver 16 may be built into the display panel 12 so as to monolithically fabricated with the display region 12a. The control board 14 is connected to the flexible printed circuit board 13 and supplies necessary signals and power to the gate driver 15 and the source driver 16. The signals and power to be supplied to the gate driver 15 from the control board 14 pass through the flexible printed circuit board 13 and are then supplied to the gate driver 15 on the display panel 12.

Next, a configuration of a shift register provided in the gate driver 15 is described with reference to Examples.

EXAMPLE 1

Example 1 of the shift register is described below with reference to FIGS. 1 through 3, 10, and 11.

Figure 2:
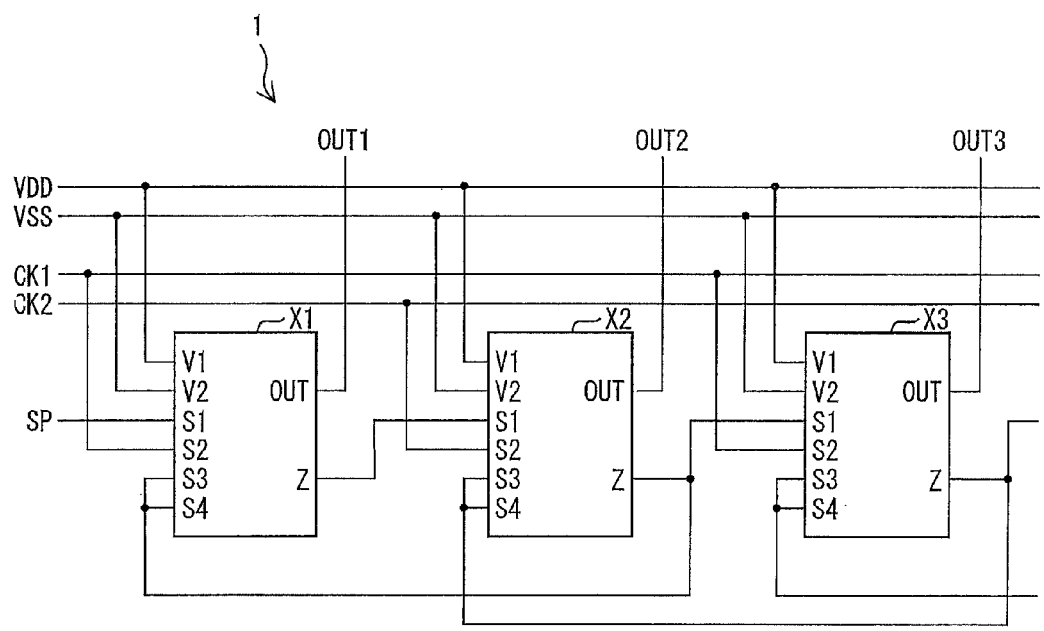
FIG. 2

FIG. 2 illustrates a configuration of a shift register 1 of the present Example.

The shift register 1 is arranged such that a plurality of stages Xi (i is a natural number) are cascaded with each other. The shift register 1 includes as many stages Xi as the gate bus lines GL. In the present Example and the subsequent Examples, a circuit in which the stages Xi are cascaded with each other is referred to as a cascade connection circuit. Each of the stages Xi includes terminals V1, V2, S1, S2, S3, S4, OUT, and Z.

In each of the odd-numbered stages Xi (i=1, 3, 5, ... ), a power supply voltage (first direct current voltage) VDD which is a High level (i.e., gate pulse level) of a gate driving voltage is supplied to the terminal V1, a power supply voltage (second direct current voltage) VSS which is a Low level of a gate driving voltage is supplied to the terminal V2, an output signal from a terminal Z of a preceding stage Xi−1 is supplied to the terminal S1, a clock signal (first clock signal) CK1 is supplied to the terminal S2, an output signal from a terminal Z of a succeeding stage Xi+1 is supplied to the terminals S3 and S4, and an output signal OUTi of the stage Xi is outputted from the terminal OUT. Note, however, that instead of an output signal OUTi−1, a gate start pulse SP is supplied to a terminal S1 of the stage X1.

In each of the even-numbered stages Xi (i=2, 4, 6, ... ), a power supply voltage (first direct current voltage) VDD which is a High level (i.e., gate pulse level) of a gate driving voltage is supplied to the terminal V1, a power supply voltage (second direct current voltage) VSS which is a Low level of the gate driving voltage is supplied to the terminal V2, an output signal from a terminal Z of a preceding stage Xi−1 is supplied to the terminal S1, a clock signal (first clock signal) CK2 is supplied to the terminal S2, an output signal from a terminal Z of a succeeding stage Xi+1 is supplied to the terminals S3 and S4, and an output signal OUTi of the stage Xi is outputted from the terminal OUT.

Note that the second direct current voltage is lower than the first direct current voltage.

To the terminal S3 of the final stage Xn, an output pulse signal whose phase lag behind, by 1 pulse, the output signal OUTi−1 of the stage Xi of the cascade connection circuit is supplied from another stage. An example of such an output pulse signal is an output pulse signal supplied from an output terminal of a dummy stage which follows the final stage Xn. The dummy stage has a similar configuration to the stage Xi, and outputs no pulse to a gate bus line GL. An output pulse of the dummy stage is referred to as a gate end pulse EP. The gate end pulse EP has an identical waveform to a pulse of the output signal OUTi and is different from the pulse of the output signal OUTi only in phase. That is, it is only necessary that, to the terminal S3 of each stage Xi, an output pulse signal whose phase lags behind (here, by 1 pulse) a phase of an output signal OUTi of the stage Xi is supplied from an output terminal of another predetermined stage of the cascade connection circuit. Further, it is also possible that (i) a dummy stage which is followed by the first stage X1 and has a similar configuration to the first stage X1 is provided, (ii) a gate start pulse is supplied to the dummy stage, and (iii) an output pulse signal of the dummy stage is supplied to the stage X1. These dummy stages are provided in order that the first stage X1 and the final stage Xn operate under the same condition as the other stages Xi. The same things are true for the other Examples.

Figure 1:
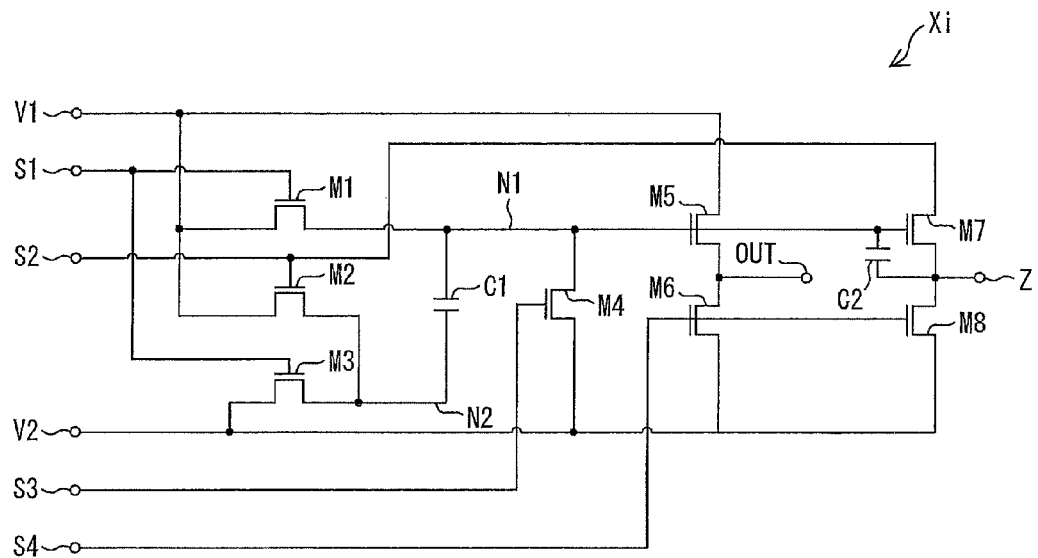
FIG. 1

Next, FIG. 1 illustrates a configuration of each stage Xi of the shift register 1.

The stage Xi includes transistors M1, M2, M3, M4, M5, M6, M7, and M8 and capacitors C1 and C2. In the present Example, the transistors M1 through M8 are all n-channel type TFTs, but may be p-channel type TFTs. The same is true for all transistors in all the Examples including a transistor M10 that is described later. Note that a gate of each switching element described later is a control terminal for controlling conduction/shutoff in the switching element.

A gate of the transistor (input gate, seventh switching element) M1 is connected to the terminal S1, a drain of the transistor M1 is connected to the terminal V1, and a source of the transistor M1 is connected to a node N1 connected to a gate of the transistor M5. One end of the capacitor (first capacitor) C1 is connected to the node N1.

A gate of the transistor (first switching element) M2 is connected to the terminal S2, a drain of the transistor M2 is connected to the terminal V1, and a source of the transistor M2 is connected to the other end of the capacitor C1 which end is opposite to the end connected to the node N1. The other end of the capacitor C1 is connected to a node N2.

A gate of the transistor (second switching element) M3 is connected to the terminal S1, a drain of the transistor M3 is connected to the node N2, and a source of the transistor M3 is connected to the terminal V2.

A gate of the transistor (third switching element) M4 is connected to the terminal S3, a drain of the transistor M4 is connected to the node N1, and a source of the transistor M4 is connected to the terminal V2.

A drain of the transistor (first output transistor) M5 is connected to the terminal V1, and a source of the transistor M5 is connected to the terminal OUT. That is, to the drain of the transistor M5, a direct current voltage which is a power supply voltage VDD is applied, and the source of the transistor M5 functions as a first output terminal which is an output terminal of the stage Xi.

A gate of the transistor (fourth switching element) M6 is connected to the terminal S4, a drain of the transistor M6 is connected to the terminal OUT, and a source of the transistor M6 is connected to the terminal V2.

A gate of the transistor (second output transistor) M7 is connected to the node N1, a drain of the transistor M7 is connected to the terminal S2, and a source of the transistor M7 is connected to the terminal (second output terminal) Z. That is, to the drain of the transistor M7, the first clock signal is supplied, and the source of the transistor M7 functions as a second output terminal which is an output terminal of the stage Xi which is different from the first output terminal.

A gate of the transistor (fifth switching element) M8 is connected to the terminal S4, and is therefore connected to the gate of the transistor M6, a drain of the transistor M8 is connected to the terminal Z, and a source of the transistor M8 is connected to the terminal V2.

The terminal Z is connected to a terminal S1 of another stage Xi to which a shift pulse from the stage Xi in the present stage is supplied, and the transistor M7 outputs the shift pulse. The transistor M8 resets the terminal Z to a Low level.

As described above, the shift register 1 is arranged such that a section which outputs a gate pulse is separated from a section which outputs a set/reset control signal such as a set signal (shift pulse) and a reset signal for another stage Xi.

One end of the capacitor (second capacitor) C2 is connected to the gate of the transistor M7, and the other end of the capacitor C2 is connected to the terminal Z.

Next, an operation of the shift register 1 is described with reference to FIG. 3.

The clock signal CK1 and the clock signal CK2 are arranged such that their active periods do not overlap each other. The present Example deals with an example in which the clock signal CK1 and the clock signal CK2 have opposite phases. In the present Example, a High level of the clock signals CK1 and CK2 is set to VDD, and a Low level of the clock signals CK1 and CK2 is set to VSS. However, it is only necessary that the High level of the clock signals CK1 and CK2 is VDD or higher, and the Low level of the clock signals CK1 and CK2 is VSS or lower. Further, the clock signals CK1 and CK2 and the gate start pulse SP each has a pulse width corresponding to 1 horizontal period (1H). The gate start pulse SP is, for example, (i) a pulse which rises in cycles of 1 vertical period and which is out of phase by half a period of the clock signal CK1 with an active clock pulse of the clock signal CK1 or (ii) a pulse which rises in cycles of 1 vertical period and which is out of phase by half a period of the clock signal CK2 with an active clock pulse of the clock signal CK2. In the present Example, a clock signal supplied to the terminal S2 is a first clock signal. In an odd-numbered stage Xi, the clock signal CK1 corresponds to the first clock signal, and in an even-numbered stage Xi, the clock signal CK2 corresponds to the first clock signal. The shift pulse supplied to the stage Xi and the first clock signal are arranged such that their active clock pulse periods (here, High level periods) do not overlap each other.

First, when the gate start pulse SP is supplied, as a shift pulse, to the terminal S1 of the stage X1, the transistors M1 and M3 are turned ON. Thus, the stage X1 starts to operate. Then, output signals OUTi are sequentially outputted from the terminals OUT of the respective stages Xi. In the following description, the node N1 of the stage Xi is referred to as "node N1 (Xi)", the node N2 of the stage Xi is referred to as "node N2 (Xi)", and an output signal from the terminal Z of the stage Xi is referred to as "Z (Xi)".

Figure 3:
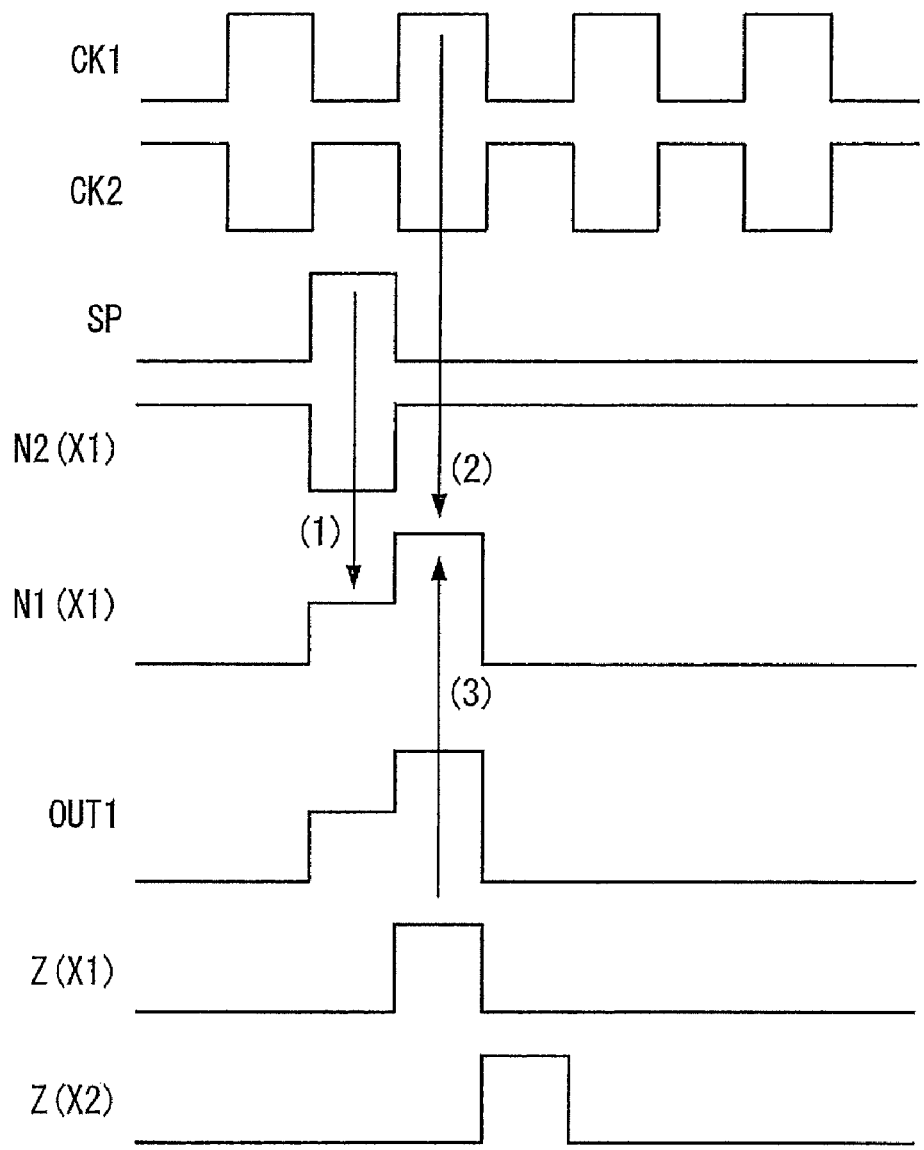
FIG. 3

It is assumed that the start pulse SP is supplied to the stage X1 as shown in FIG. 3. In the stage X1, this causes a voltage to be applied from the terminal V1 to the node N1 (X1) via the transistor M1 and causes the power supply voltage VSS to be applied from the terminal V2 to the node N2 (X1) via the transistor M3. When the capacitor C1 is charged until an electric potential of the node N1 (X1) reaches (power supply voltage VDD)−(threshold voltage Vth of the transistor M1) (see (1) of FIG. 3), the transistor M1 is turned OFF. As a result, a potential difference of (power supply voltage VDD)−(threshold voltage Vth of the transistor M1)−(power supply voltage VSS) occurs between both ends of the capacitor C1. This increases the electric potential of the node N1 (X1), and this state is preserved. Note that a value of the power supply voltage VDD is set so that a voltage (voltage of the terminal Z) supplied to a terminal S1 of a succeeding stage Xi+1 which is determined by the electric potential of the node N1 (Xi) obtained at this moment is equal to or smaller than a threshold voltage Vth of a transistor M1 of the succeeding stage Xi+1. In this way, the transistor M1 functions as an input gate to which a shift pulse to be supplied to the stage Xi is supplied and which passes through a voltage to be applied to the node N1 during a pulse period of the shift pulse. As for the stage X1, the gate start pulse SP serves as the shift pulse, and as for the other stages Xi, a gate pulse contained in an output signal OUTi−1 of a preceding stage Xi−1 serves as the shift pulse.

Next, in the stage X1, the shift pulse (here, the gate start pulse SP (an output signal Z (Xi−1) of a preceding stage in a case where i≧2 is satisfied)) falls, which causes the transistor M3 to be turned OFF.

Next, the clock signal CK1 which serves as the first clock signal supplied from the terminal S2 rises to a High level, so that the transistor M2 is turned ON. Then, as a result of voltage application from the terminal V1, an electrical potential of the node N2 (X1) becomes (power supply voltage VDD)−(threshold voltage Vth). This pushes up the electrical potential of the node N1 (X1) via the capacitor C1 (see (2) of FIG. 3), which causes the transistor M5 to be turned ON. At this moment, the potential difference of VDD−Vth−VSS is preserved between both ends of the capacitor C1. Accordingly, the electrical potential V (N1) of the node N1 (X1) is expressed by the following equation:

$$V(N1) = (VDD - Vth - VSS) + (VDD - Vth) = 2 \times VDD - (VSS + 2 \times Vth)$$

Accordingly, the gate of the transistor M5 has a sufficiently high electric potential V (N1) as compared to VDD, and the transistor M5 is turned ON so as to have a sufficiently small channel resistance. Consequently, the power supply voltage VDD is supplied, as the output signal OUT1, from the terminal V1 to the terminal OUT via the transistor M5. The output signal OUT (N−1) from the terminal OUT becomes a gate pulse whose amplitude is VDD−VSS. Further, at this moment, the transistor M7 also is turned ON, and a High level (active level) of the clock signal CK1 supplied from the terminal S2 is supplied to the terminal Z. This is affected by pushing up of the gate electric potential of the transistor M7 via the capacitor C2. That is, the capacitor C2 also contributes to the pushing up of the electric potential of the node N1 (X1) (see (3) of FIG. 3).

Then, a pulse of the output signal Z (X1) is supplied to the terminal S1 of the succeeding stage X2, which charges the capacitor C1 of the stage X2. Then, since a High level of the clock signal CK2 which is the first clock signal is supplied to the terminal S2, an electric potential of the node N1 (X2) is pushed up. This causes the transistor M5 to be turned ON. Consequently, the power supply voltage VDD is outputted, as an output signal OUT2, from the terminal OUT via the transistor M5, and then becomes a gate pulse. Further, a High level (active level) of the clock signal CK2 is supplied, as an output signal Z (X2), to the terminal Z via the transistor M7. A pulse of the output signal Z (X2) is supplied to the terminals S3 and S4 of the stage X1. This causes the transistors M4, M6, and M8 of the stage X1 to be turned ON. Accordingly, the electric potential of the node N1 (X1) declines to the power supply voltage VSS. Consequently, the gate pulse as the output signal OUT (N) and the shift pulse as the output signal Z (X1) fall. Thus, the stage X1 is reset.

In this way, gate pulses of output signals OUTi are sequentially supplied to respective gate bus lines GL.

As described above, according to the shift register 1, the power supply voltage VDD which serves as the first direct current voltage is applied to a drain (end opposite to a gate drive output side) of the transistor M5 which outputs a gate pulse, and a switched capacitor operation is carried out with the use of the transistors M2 and M3 and the capacitor C1. This makes it possible to prevent (i) output voltage fluctuation which occurs in a case where a clock signal is supplied to the drain of the transistor M5 and (ii) charge leakage from a liquid crystal picture element electrode which occurs due to the output voltage fluctuation.

Further, since the direct current voltage is applied to the drain of the transistor M5, a gate bus line can be driven with a direct current power supply. This can achieve a large reduction in load on an external level shifter which generates a control signal for the shift register, as compared with a case where a clock signal is supplied to the drain of the transistor M5 and the gate bus line is driven with the clock signal.

Since the direct current voltage is applied to the drain of the transistor M5, a period of time in which a negative bias is applied between the gate and drain of the transistor M5 becomes longer. This can reduce a rise in threshold voltage. Since the gate bus line is not driven with the clock signal, the clock signal can have any amplitude. Specifically, a Low level can be set to VSS or lower and a High level can be set to VDD or higher. In a case where the High level is set to a value higher than VDD, an ON current for a transistor having a gate to which the High level is supplied increases, thereby allowing an improvement in operation speed. In a case where the Low level is set to a value lower than VSS, an OFF current for a transistor having a gate to which the Low level is supplied declines, thereby making it possible to prevent occurrence of malfunction of a level shifter due to a leak current.

Further, in the case where the Low level is set to a value smaller than VSS, a gate potential can be made smaller than a source potential and a drain potential. This makes it possible to reduce a change with time of a threshold voltage Vth which occurs due to a direct current voltage component applied to the gate, thereby preventing performance degradation of a shift register.

Figure 13:
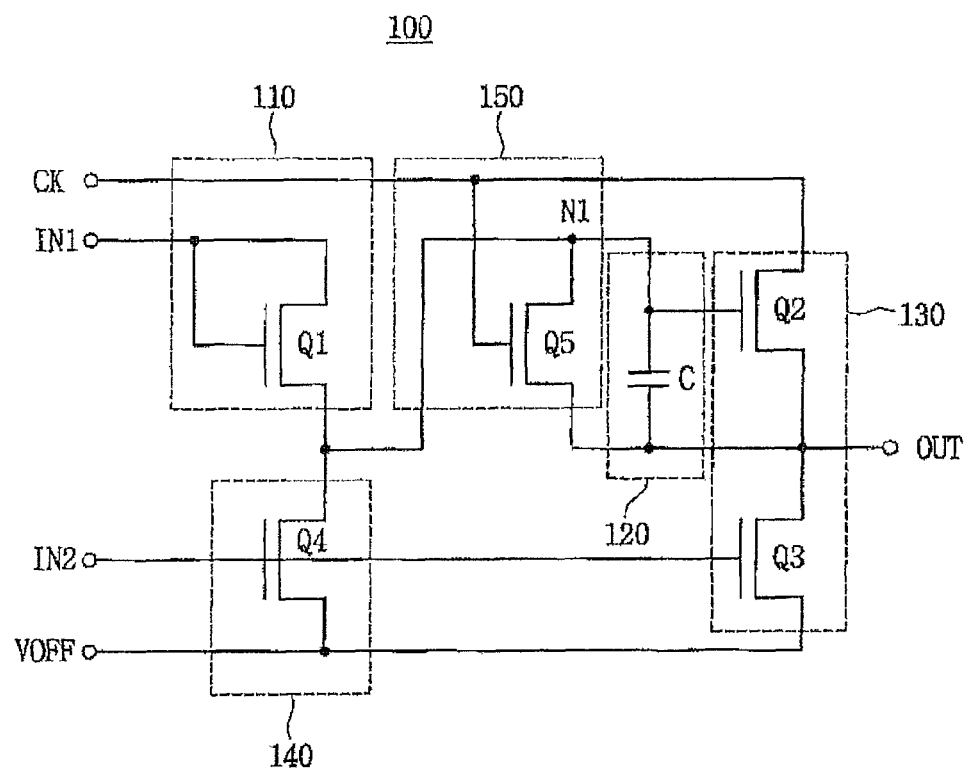
FIG. 13
Figure 14:
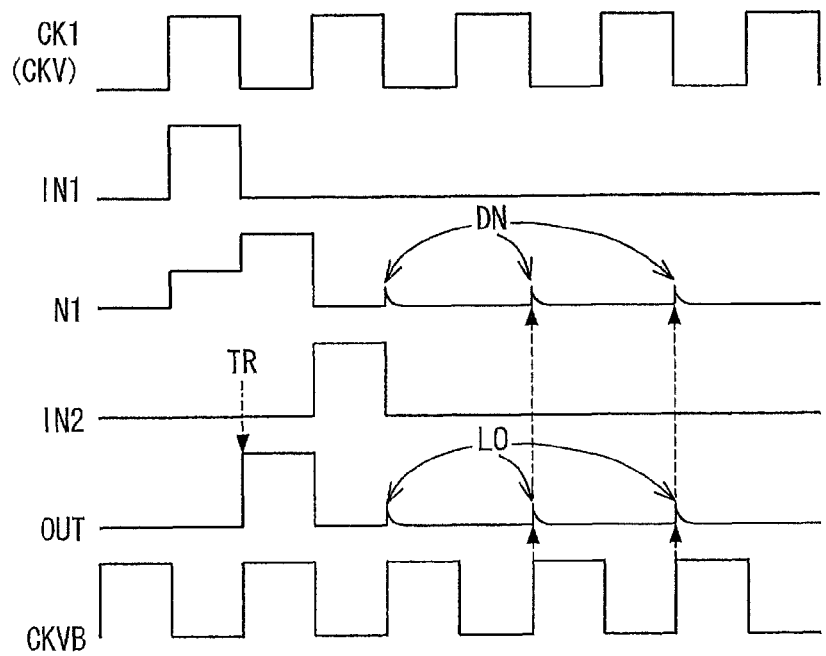
FIG. 14

According to the circuit configuration disclosed in Patent Literature 1, a clock signal is supplied to the drain of the output transistor Q2 (see FIGS. 13 and 16). Accordingly, output fluctuation occurs for each clock due to clock feed-through. In order to suppress the output fluctuation, a control signal for the transistor Q3 need to be a clock signal.

Meanwhile, according to the shift register 1, the direct current voltage is supplied to the drain of the transistor M5, and therefore no noise occurs in the terminal OUT for each clock. Accordingly, it is possible to carry out an operation in which an output pulse from a succeeding stage is supplied, as a control pulse, to the gate of the transistor M6 only one time so that the terminal OUT maintains a Low level until gate driver output of a next frame.

Since output of a succeeding stage is thus supplied to the gate of the transistor M6, there occurs no clock feed-through, which occurs due to input of a clock signal to the gate, and no threshold voltage shift phenomenon. This makes it possible to prevent fluctuation in electric potential of the terminal OUT well until next stage output from the terminal OUT.

In a case where a section in which a plurality of successive stages Xi (see FIG. 1) are cascaded with each other is referred to as a successive stage group, the cascade connection circuit in the example shown in FIG. 2 is a successive stage group. However, the present invention is not limited to this The cascade connection circuit may partially include a successive stage group (e.g., may include a successive stage group and the dummy stages). Note that in a case where a dummy stage has an identical configuration to that of the stage Xi recited in claims, a group in which the dummy stage and stages Xi are cascaded with each other can be deemed as a successive stage group. Further, the cascade connection circuit may include a plurality of successive stage groups which are separated by one or more stages different from the stage Xi. For example, such a cascade connection circuit is preferably used in a case where each of the successive stage groups drives a corresponding group of gate bus lines GL. The same things are true for the other Examples.

Each of the Examples deals with an example in which only one gate driver is provided, but one or more cascade connection circuits can be provided on a display panel. This is clear from the fact that there are cases where a gate driver is constituted by a plurality of IC chips and cases where a plurality of gate drivers sandwiching the display region 12a are provided.

In the shift register 1, it is only necessary that a pulse signal whose phase lags behind a phase of a shift pulse (here, output signal OUTi) outputted from the terminal OUT of the stage Xi is supplied to the conduction/shutoff control terminal of the third switching element (here, the transistor M4). In the present Example, to each of the stages Xi except the final stage, an output signal OUTi of a succeeding stage Xi+1 is supplied. To the final stage Xi, an output signal from a certain stage (e.g., the dummy stage) in a cascade connection circuit can be supplied.

Further, in the shift register 1, as to each of the stages Xi of the successive stage group except the final stage, a shift pulse (here, output signal OUTi) outputted from a terminal OUT of a succeeding stage Xi+1 is supplied to a conduction/shutoff control terminal of a fourth switching element (here, the transistor M6). As to the final stage Xi of the successive stage group, a pulse signal whose phase lags behind a phase of a shift pulse outputted from a terminal OUTi of the final stage Xi is supplied to a conduction/shutoff control terminal of a fourth switching element (here, the transistor M6). To the final stage Xi, an output signal from a certain stage (e.g., the dummy stage) in a cascade connection circuit can be supplied.

Further, to the gate of the transistor M1, a third direct current voltage that is different from the first direct current voltage may be applied. Thus, a charging potential of the node N1 is not constrained by the power supply voltage VDD.

Next, effects produced by the capacitor C2 provided in each stage Xi is described.

Figure 10:
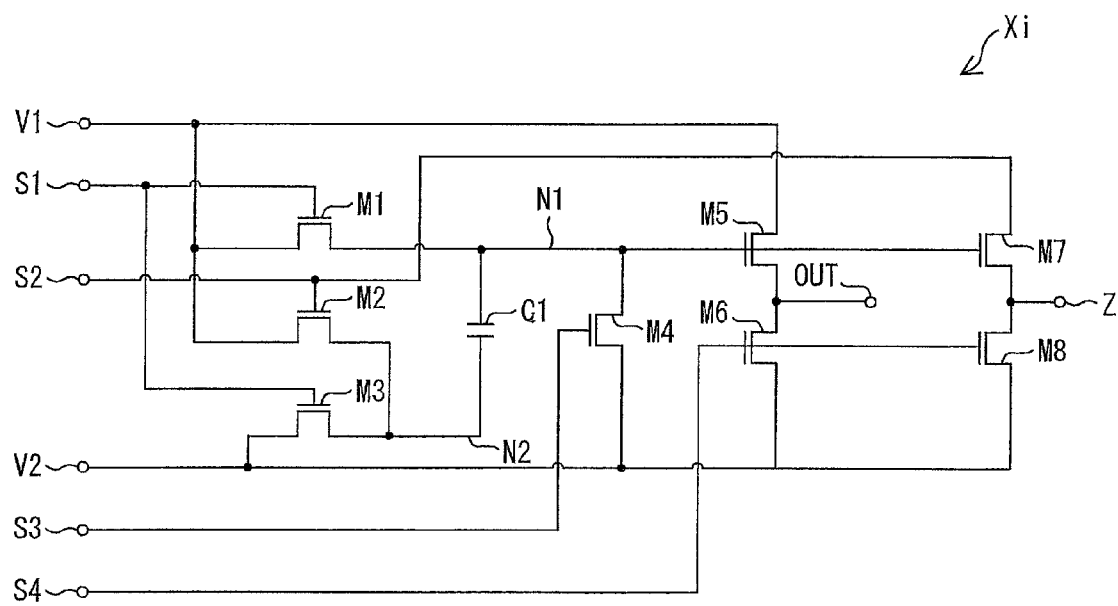
FIG. 10

FIG. 10 illustrates a stage Xi which is obtained by removing the capacitor C2 from the stage Xi of FIG. 1.

According to the arrangement, the node N1 boosted by the capacitor C1 must cause power sufficient enough to supply an output signal to both of the load connected to the terminal OUT and the load connected to the terminal Z to be given to the output transistors (the transistors M5 and M7) which require large driving force. Accordingly, a capacitance value of the capacitor C1 need to be increased so that large energy for boosting is supplied to the switched capacitor operation.

Consequently, a size of the capacitor C1 and sizes of the transistors M1, M2, M3, and M4, which are TFTs related to charging/discharging of the capacitor C1, are increased. This increase in size causes an increase in area of a gate driver section on a panel, thereby causing an increase in rate of occurrence of a defect. As a result, there occurred a decline in yield. Further, the increase in size of a capacitor and transistors (especially TFTs) caused an increase in load on an operation circuit of a driver circuit, and was therefore disadvantageous for high-speed operation.

Meanwhile, according to the shift register 1 of the present Example, both of the load connected to the terminal OUT and the load connected to the terminal Z are driven to be boosted by the capacitor C1 and the capacitor C2 that is provided between the node N1 and the terminal Z. This produces the following advantages. (1) Since the capacitor C2 is provided between the node N1 and the terminal Z in order to boost a gate signal of the transistor M7 connected to the terminal Z which outputs a shift pulse, it is possible to secure a further sufficient boosting voltage in addition to a boosting function of the gate-drain parasitic capacitor provided in the transistor M7. The capacitor C2 is preferably disposed in proximity to the transistor M7. The capacitance value of the capacitor C2 is not limited in particular, provided that the parasitic capacitor of the transistor M7 is compensated and the boosting voltage is obtained. Accordingly, the capacitance value and size of the capacitor C2 need not to be very large. (2) Since the capacitor C2 is added, the capacitance value of the capacitor C1 can be any value which can sufficiently boosts, mainly, a gate signal of the transistor M5, and therefore can be a value smaller than that in a circuit in which both of the transistor M5 and the transistor M7 are boosted by the capacitor C1. (3) Since the capacitor C1 has a smaller capacitance value, each of the transistors M1, M2, M3, and M4 that are related to charging/discharging of the capacitor C1 can have a smaller size.

Because of (1) and (2), the total capacitance value of the capacitor C1 and the capacitor C2 can be made equal to or smaller than the value of the capacitor C1 achieved before the improvement, and because of (3), the sizes of the transistors M1, M2, M3, and M4 can be made smaller than those before the improvement. This allows the total area of the gate driver to be smaller than that before the improvement. Further, it is possible to reduce the proportion of the transistors, especially the TFTs to the gate driver.

Since the driver area can be reduced, a reduction in size and cost of a display panel can be expected. Further, the reduction in capacitance value and in size of the transistors leads to suppression of a reduction in yield caused by defects, thereby contributing to an improvement in yield of a display panel and a reduction in cost of the display panel.

Figure 4:
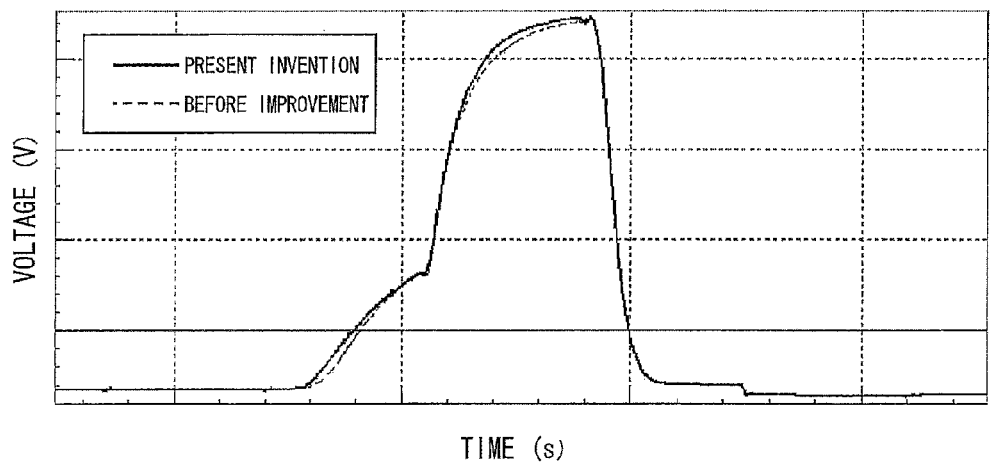
FIG. 4
Figure 5:
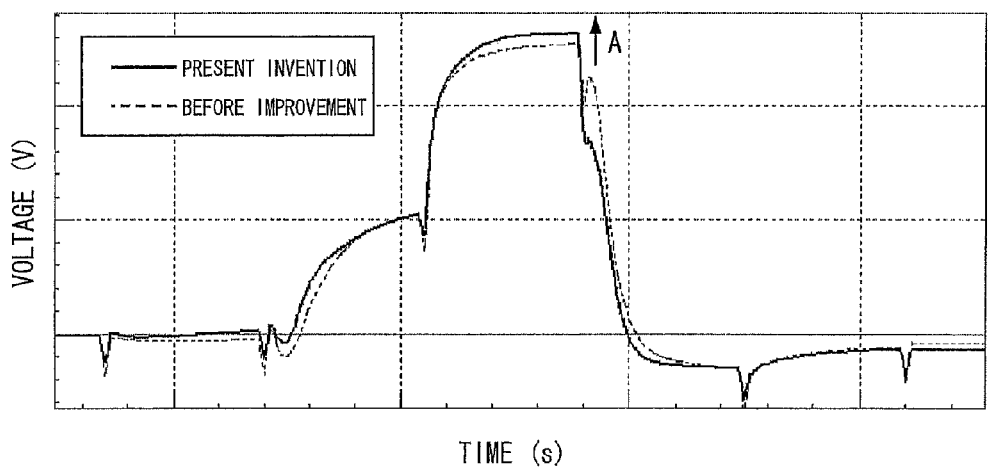
FIG. 5

FIG. 4 shows simulation electric potential waveforms which an output signal from the terminal OUT exhibits in a case where the capacitor C2 is provided and in a case where the capacitor C2 is not provided. FIG. 5 shows simulation electric potential waveforms which the node N1 exhibits in a case where the capacitor C2 is provided and in a case where the capacitor C2 is not provided. The simulation was conducted under a condition that a threshold value of each TFT is shifted due to operation aging of the TFT and thus driving capability declines.

The solid line is a waveform for the shift register of the present invention which includes the capacitor C2, and the broken line is a waveform for a shift register which is not improved, i.e., a shift register achieved before the improvement which does not include the capacitor C2.

In the present invention, a capacitance value of the capacitor C1 is ½ times that of a capacitor C1 of the shift register achieved before the improvement, and a capacitance value of the capacitor C2 is ¼ times that of the capacitor C1 of the shift register achieved before the improvement. Further, in the present invention, a size of each of the transistors M1, M2, M3, and M4 is ½ times that of the shift register achieved before the improvement.

As is clear from FIG. 4, output equal to or larger than that of the shift register achieved before the improvement can be obtained even in a case where the total capacitance and sizes of the transistors M1, M2, M3, and M4 are reduced.

Further, as is clear from FIG. 5, the boosting electric potential of the node N1 is improved (see the change A) due to a boot effect from the capacitor C1 and the capacitor C2 as compared with the comparative example.

As described above, even in a case where the total capacitance and the TFT size are reduced, a circuit operation which can sufficiently endure driving of the loads can be obtained by boosting the electric potential of the node N1, which becomes a gate signal of an output transistor, by use of not only the capacitor C1 but also the capacitor C2.

The following describes a configuration disclosed in Patent Literature 6.

Figure 11:
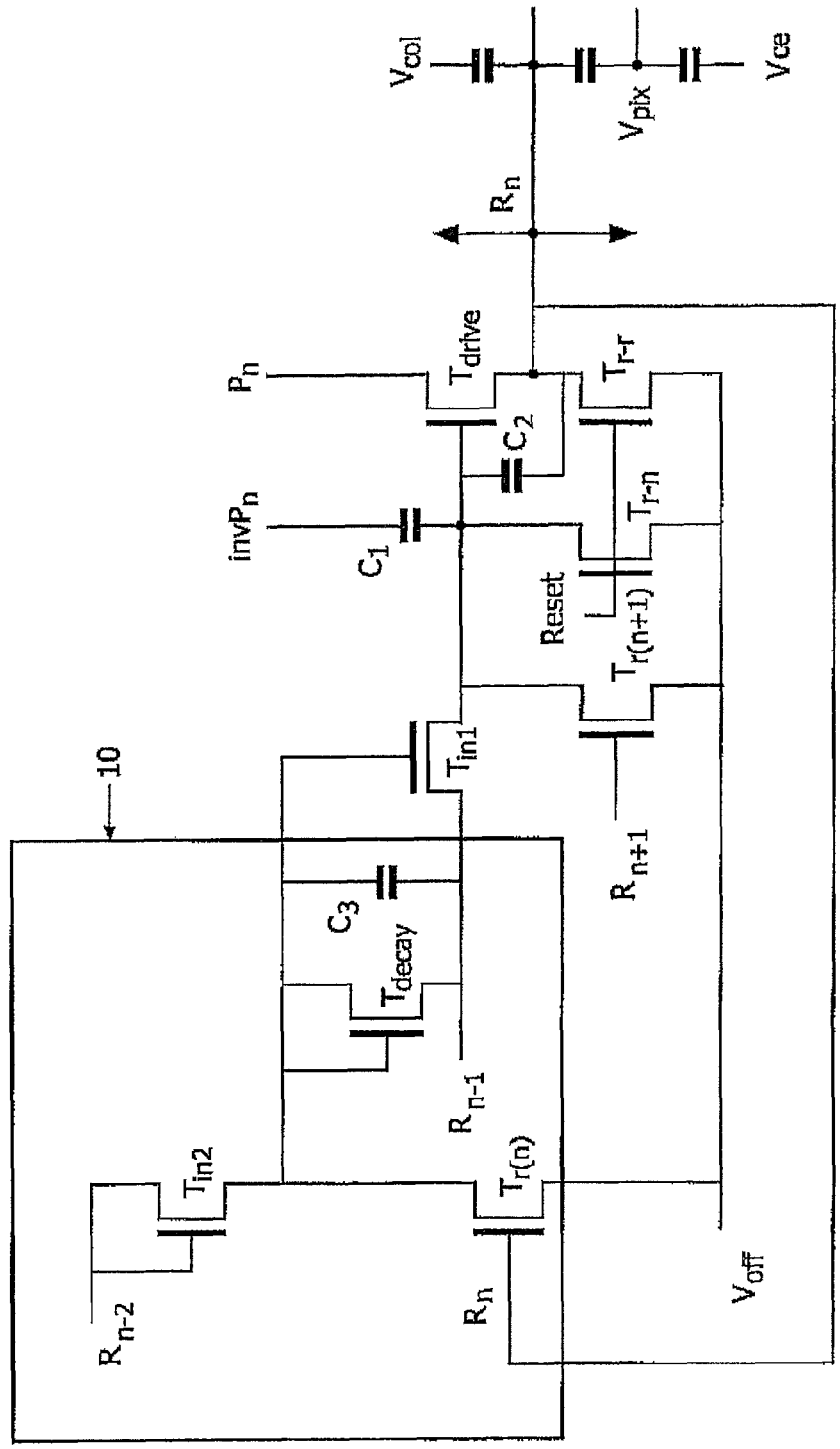
FIG. 11
Figure 12:
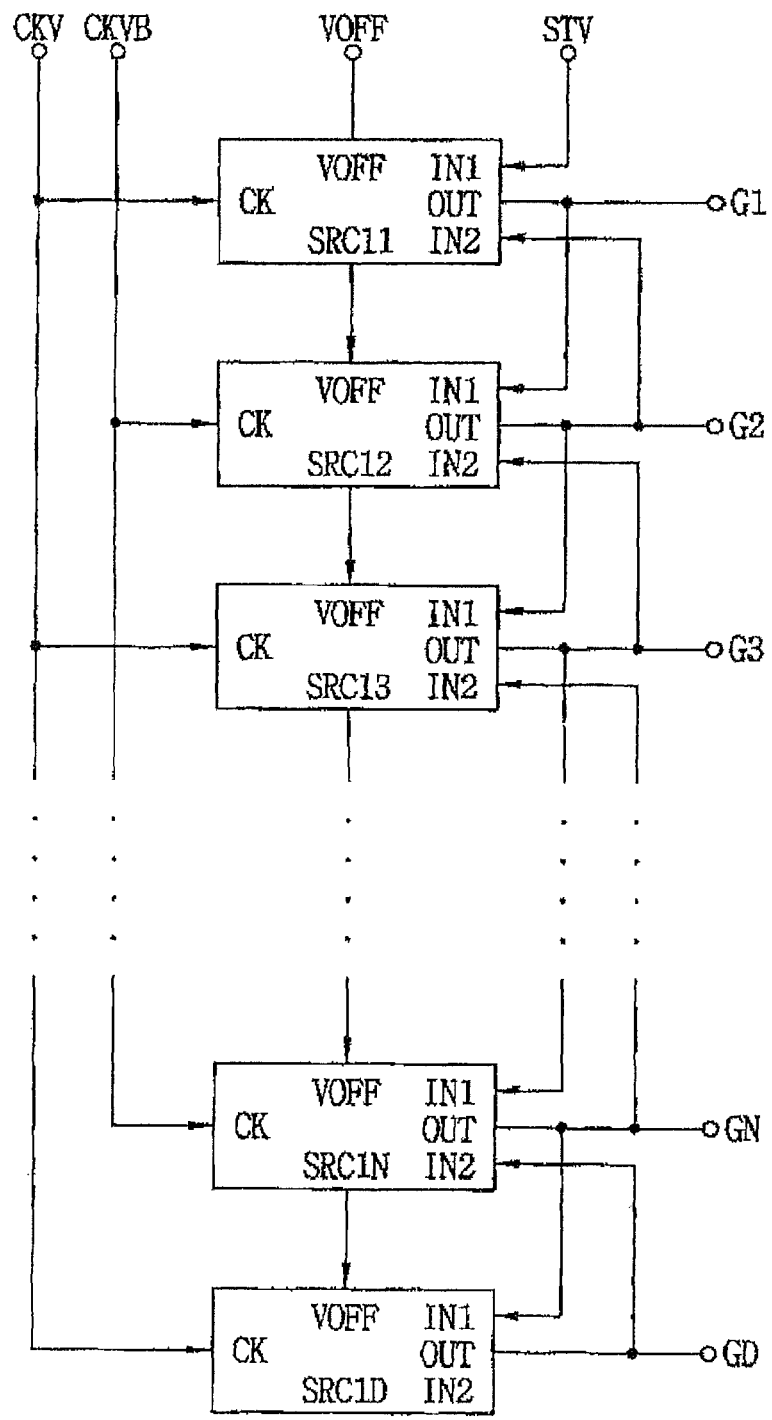
FIG. 12

FIG. 11 shows a stage configuration of a shift register disclosed in Patent Literature 6.

According to the configuration, a capacitor C2 is connected to a transistor Tdrive having a source connected to a terminal of a CK signal (connection same as the transistor M7 of the present Example) in order to boost the transistor Tdrive, and a capacitor C3 which boosts a gate voltage of a transistor Tin1 which gives a gate signal of the transistor Tdrive is connected to the transistor Tin1. That is, two boot capacitors are used.

However, since the two boot capacitors, i.e., the capacitors C2 and C3 are used to boost the gate signal of the transistor Tdrive, it is necessary to add an input Rn−2 to a shift operation in order that the capacitor C3 boosts the gate voltage of the transistor Tin1. This causes an increase in the number of signals and connections for the shift register operation. Since the number of wiring layers is generally limited in an LCD panel on which this circuit is formed, an increase in the number of connection signals is not preferable.

Such problems do not arise in the shift register 1 of the present Example.

EXAMPLE 2

Example 2 of the shift register is described below with reference to FIGS. 6 and 7.

FIG. 7 illustrates a configuration of a shift register 2 of the present Example.

The shift register 2 is arranged such that a plurality of stages Xi (i is a natural number) are cascaded with each other. The shift register 1 includes as many stages Xi as the gate bus lines GL. Each of the stages Xi includes terminals V1, V2, S1, S2, S3, S4, OUT, Z1, and Z2.

In each of the odd-numbered stages Xi (i=1, 3, 5, . . . ), a power supply voltage (first direct current voltage) VDD which is a High level (i.e., gate pulse level) of a gate driving voltage is supplied to the terminal V1, a power supply voltage (second direct current voltage) VSS which is a Low level of a gate driving voltage is supplied to the terminal V2, an output signal from the terminal Z of a preceding stage Xi−1 is supplied to the terminal S1, and a clock signal (first clock signal) CK1 is supplied to the terminal S2. To the terminal S3, an output signal from the terminal Z1 of a succeeding stage Xi+1 is supplied, and to the terminal S4, an output signal from the terminal Z2 of the succeeding stage Xi+1 is supplied. From the terminal OUT, an output signal OUTi of the stage Xi is outputted. Note, however, that instead of an output signal OUTi−1, a gate start pulse SP is supplied to the terminal S1 of the stage X1.

In each of the odd-numbered stages Xi (i=2, 4, 6, . . . ), a power supply voltage (first direct current voltage) VDD which is a High level (i.e., gate pulse level) of a gate driving voltage is supplied to the terminal V1, a power supply voltage (second direct current voltage) VSS which is a Low level of a gate driving voltage is supplied to the terminal V2, an output signal from the terminal Z of a preceding stage Xi−1 is supplied to the terminal S1, and a clock signal (first clock signal) CK2 is supplied to the terminal S2. To the terminal S3, an output signal from the terminal Z1 of a succeeding stage Xi+1 is supplied, and to the terminal S4, an output signal from the terminal Z2 of the succeeding stage Xi+1 is supplied. From the terminal OUT, an output signal OUTi of the stage Xi is outputted.

In the present Example, a signal supplied to the terminal S3 is referred to as a first pulse signal, and a signal supplied to the terminal S4 is referred to as a second pulse signal. The first pulse signal and second pulse signal supplied to each stage Xi are pulse signals whose phases lag behind a phase of a shift pulse outputted from the terminal Z1 of the stage Xi.

Note that the second direct current voltage is lower than the first direct current voltage.

Next, FIG. 6 illustrates a configuration of each stage Xi of the shift register 2.

The stage Xi of the shift register 2 is obtained by adding transistors M9 and M10 and a capacitor C3 to the stage Xi of the shift register 1 of FIG. 1. The terminal Z of the stage Xi of the shift register 1 is referred to as a terminal Z1.

A gate of the transistor (third output transistor) M9 is connected to a node N1, a drain of the transistor M9 is connected to the terminal S2, and a source of the transistor M9 is connected to the terminal (third output terminal) Z2. That is, to the drain of the transistor M9, the first clock signal is supplied, and the source of the transistor M9 functions as a third output terminal which is an output terminal of the stage Xi different from a first output terminal and a second output terminal.

A gate of the transistor (sixth switching element) M10 is connected to the terminal S4, and is therefore connected to a gate of the transistor M6, a drain of the transistor M10 is connected to the terminal Z2, and a source of the transistor M10 is connected to the terminal V2.

A pulse outputted from the terminal Z1 is supplied, as a shift pulse, to the terminal S1 of a succeeding stage Xi+1, and is supplied to the terminal S3 of a preceding stage Xi−1 so as to reset a node N1 of the stage Xi−1 to a Low level.

A pulse outputted from the terminal Z2 is supplied to the terminal S4 of the preceding stage Xi−1 so as to reset the terminals OUT, Z1, and Z2 of the stage Xi−1 to a Low level.

As described above, in the shift register 1, a section which outputs a gate pulse, a section which outputs a set signal (shift pulse) for another stage Xi and a reset signal (first pulse signal) for a node N1, and a section which outputs a reset signal (second pulse signal) for output terminals of another stage Xi are separated from each other so as to drive respective loads. This makes it possible to prevent interference between (i) the set signal (shift pulse) for another stage Xi and the reset signal (first pulse signal) for the node N1 and (ii) the reset signal (second pulse signal) for output terminals of another stage Xi.

One end of a capacitor (third capacitor) C3 is connected to the gate of the transistor M9, and the other end of the capacitor C3 is connected to the terminal Z2.

A signal outputted from the terminal Z1 of each of the stages Xi of the successive stage group except the first stage is used as a shift pulse and a reset signal for a node N1 of a preceding stage Xi−1, and a signal outputted from the terminal Z2 of each of the stages Xi of the successive stage group except the first stage is used as a shift pulse and a reset signal for output terminals of a preceding stage Xi−1. As a reset signal for a node N1 of the final stage of the successive stage group and a reset signal for output terminals of the final stage, output signals from the dummy stage can be used for example.

According to the shift register 2 of the present Example, the capacitors C2 and C3 are provided in a further output section. Accordingly, the total capacitance of the capacitor C1, C2, and C3 and the sizes of the transistor M1, M2, M3, and M4 can be reduced as compared with a case where the capacitors C2 and C3 are not provided and a case where the capacitor C3 is not provided, as in Example 1. Further, even if the total capacitance and the transistor sizes are thus reduced, a circuit operation which can sufficiently endure driving of loads can be obtained.

Examples have been described.

Figure 9:
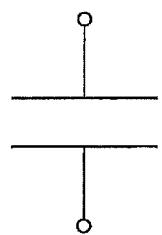
FIG. 9
Figure 9:
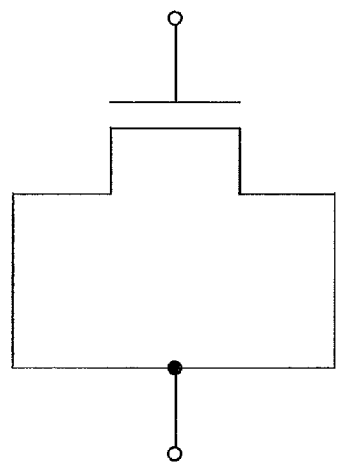

In Examples, each of the capacitors C1, C2, and C3 can be, for example, a parallel plate capacitor constituted by two conductive plates facing each other and an insulator sandwiched by the two conductive plates as shown in (a) of FIG. 9 or a MOS capacitor in which a drain and a source of a MOS transistor are short-circuited as shown in (b) of FIG. 9.

In order to attain the above object, a shift register of the present invention includes one or more cascade connection circuits in each of which stages are cascaded with each other so that a shift pulse is transmitted, at least one of the one or more cascade connection circuits including, among all stages thereof, a successive stage group constituted by successive stages, each stage of the successive stage group including:

a first output transistor having a drain to which a first direct current voltage is applied and a source serving as a first output terminal which is an output terminal of said each stage;

a second output transistor having (i) a drain to which a first clock signal corresponding to said each stage is supplied, the first clock signal having an active clock pulse period which does not overlap a period of a shift pulse for said each stage, and (ii) a source serving as a second output terminal which is an output terminal of said each stage and which is different from the first output terminal;

a first capacitor having one end connected to a gate of the first output transistor and a gate of the second output transistor;

a second capacitor having one end connected to the one end of the first capacitor and other end connected to the second output terminal;

an input gate to which the shift pulse for said each stage is supplied and through which an electric potential to be supplied to the one end of the first capacitor passes during a pulse period of the shift pulse for said each stage;

a first switching element having one end connected to the other end of the first capacitor, the other end to which the first direct current voltage is applied, and a conduction/shutoff control terminal to which the first clock signal is supplied;

a second switching element having one end connected to the other end of the first capacitor, the other end to which a second direct current voltage lower than the first direct current voltage is applied, and a conduction/shutoff control terminal to which the shift pulse for said each stage is supplied;

a third switching element having one end connected to the one end of the first capacitor, the other end to which the second direct current voltage is applied, and a conduction/shutoff control terminal to which a pulse signal whose phase lags behind a phase of a shift pulse outputted from the second output terminal of said each stage is supplied;

a fourth switching element having one end connected to the first output terminal, the other end to which the second direct current voltage is applied, and a conduction/shutoff control terminal (i) to which, in a case where said each stage is not a final stage of the successive stage group, a shift pulse outputted from the second output terminal of a succeeding stage is supplied and (ii) to which, in a case where said each stage is the final stage of the successive stage group, a pulse signal whose phase lags behind a phase of a shift pulse outputted from the second output terminal of the final stage is supplied; and a fifth switching element having one end connected to the second output terminal, the other end to which the second direct current voltage is applied, and a conduction/shutoff control terminal connected to the conduction/shutoff control terminal of the fourth switching element.

According to the invention, the first direct current voltage is applied to the drain of the first output transistor, and a switched capacitor operation is carried out with the use of the first switching element, the second switching element, and the first capacitor. This makes it possible to prevent a feed-through phenomenon from occurring through a drain parasitic capacitor and a source parasitic capacitor of the first output transistor. It is therefore possible to prevent (i) output voltage fluctuation which occurs in a case where a clock signal is supplied to the drain of the first output transistor and (ii) charge leakage from a picture element electrode which occurs due to the output voltage fluctuation. This eliminates the need for addition of a circuit for frequently connecting the first output terminal of the stage to a Low power supply.

As a result, it is possible to provide a shift register which can suppress noise of each stage output well without causing an increase in circuit scale.

Further, it is possible to prevent a situation in which an electric potential of one end of the first capacitor is pushed up due to capacitive coupling so that an output of the second output terminal rises during an undesired period, thereby preventing malfunction of the shift register. Further, it is possible to reduce the number of required external input signals to be supplied to the shift register.

Since the second output transistor is used to output a shift pulse to be transmitted through the stages, the size of the second output transistor can be made much smaller than that of the first output transistor which is used for output to an outside of the shift register. Accordingly, the drain parasitic capacitor of the second output transistor is sufficiently small as compared with the drain parasitic capacitor and the source parasitic capacitor of the first output transistor and with the first capacitor. Consequently, even if the first clock signal is supplied to the drain of the second output transistor, an influence of pushing up of the electric potential of one end of the first capacitor by capacitive coupling can be ignored.

Further, since load driven by the second output terminal is sufficiently smaller than load driven by the first output terminal, a change amount of a load on an external level shifter which generates a control signal for the shift register can be ignored.

Further, since both of the load connected to the first output terminal and the load connected to the second output terminal are driven to be boosted by the first capacitor and the second capacitor that is provided between one end of the first capacitor and the second output terminal, the total capacitance value of the first capacitor and the second capacitor can be made equal to or smaller than a value of the first capacitor obtained in a case where the second capacitor is not provided, and sizes of the input gate, the first switching element, the second switching element, and the third switching element can be made smaller than those obtained in a case where the second capacitor is not provided. Accordingly, it is possible to reduce a total area of a circuit using the shift register as compared with a case where the second capacitor is not provided. Further, it is possible to reduce proportion of transistors, especially TFTs to the shift register.

Further, since the area of the circuit using the shift register is reduced, it is possible to reduce a size and a cost of a display panel using the circuit as a driver. The reduction in capacitance value and sizes of elements such as transistors leads to suppression of a reduction in yield caused by detects, thereby contributing to improvement in yield of a display panel and a reduction in cost of the display panel.

Further, since the direct current voltage is applied to the drain of the first output transistor, a gate bus line can be driven by a direct current power supply. This makes it possible to greatly reduce a load on an external level shifter which generates a control signal for the shift register as compared with a case where a clock signal is supplied to the drain of the first output transistor so that a gate bus line is driven by the clock signal.

Further, since the direct current voltage is applied to the drain of the first output transistor, a period of time in which a negative bias is applied between the gate and the drain of the first output transistor is prolonged. This allows a reduction in rise of a threshold voltage, thereby preventing degradation of performance of the shift register.

In order to attain the above object, a shift register of the present invention includes one or more cascade connection circuits in each of which stages are cascaded with each other so that a shift pulse is transmitted, at least one of the one or more cascade connection circuits including, among all stages thereof, a successive stage group constituted by successive stages, each stage of the successive stage group including:

a first output transistor having a drain to which a first direct current voltage is applied and a source serving as a first output terminal which is an output terminal of said each stage;

a second output transistor having (i) a drain to which a first clock signal corresponding to said each stage is supplied, the first clock signal having an active clock pulse period which does not overlap a period of a shift pulse for said each stage, and (ii) a source serving as a second output terminal which is an output terminal of said each stage and which is different from the first output terminal;

a third output transistor having a drain to which the first clock signal is supplied and a source serving as a third output terminal which is an output terminal of said each stage and which is different from the first output terminal and the second output terminal;

a first capacitor having one end connected to a gate of the first output transistor, a gate of the second output transistor, and the third output transistor;

a second capacitor having one end connected to the one end of the first capacitor and other end connected to the second output terminal;

a second capacitor having one end connected to the one end of the first capacitor and having the other end connected to the third output terminal;

an input gate to which the shift pulse for said each stage is supplied and through which an electric potential to be supplied to the one end of the first capacitor passes during a pulse period of the shift pulse for said each stage;

a first switching element having one end connected to the other end of the first capacitor, the other end to which the first direct current voltage is applied, and a conduction/shutoff control terminal to which the first clock signal is supplied;

a second switching element having one end connected to the other end of the first capacitor, the other end to which a second direct current voltage lower than the first direct current voltage is applied, and a conduction/shutoff control terminal to which the shift pulse for said each stage is supplied;

a third switching element having one end connected to the one end of the first capacitor, the other end to which the second direct current voltage is applied, and a conduction/shutoff control terminal to which a first pulse signal whose phase lags behind a phase of a shift pulse outputted from the second output terminal of said each stage is supplied;

a fourth switching element having one end connected to the first output terminal, the other end to which the second direct current voltage is applied, and a conduction/shutoff control terminal to which a second pulse signal whose phase lags behind the phase of the shift pulse outputted from the second output terminal of said each stage is supplied; and a fifth switching element having one end connected to the second output terminal, the other end to which the second direct current voltage is applied, and a conduction/shutoff control terminal connected to the conduction/shutoff control terminal of the fourth switching element, a signal outputted from the second output terminal of each of the stages of the successive stage group except a first stage being used as a shift pulse and the first pulse signal for a preceding stage, and a signal outputted from the third output terminal of each of the stages of the successive stage group except the first stage being used as the second pulse signal for the preceding stage.

According to the invention, the first direct current voltage is applied to the drain of the first output transistor, and a switched capacitor operation is carried out with the use of the first switching element, the second switching element, and the first capacitor. This makes it possible to prevent a feedthrough phenomenon from occurring through a drain parasitic capacitor and a source parasitic capacitor of the first output transistor. It is therefore possible to prevent (i) output voltage fluctuation which occurs in a case where a clock signal is supplied to the drain of the first output transistor and (ii) charge leakage from a picture element electrode which occurs due to the output voltage fluctuation. This eliminates the need for addition of a circuit for frequently connecting the first output terminal of the stage to a Low power supply.

As a result, it is possible to provide a shift register which can suppress noise of each stage output well without causing an increase in circuit scale.

Further, it is possible to prevent a situation in which an electric potential of one end of the first capacitor is pushed up due to capacitive coupling so that an output of the second output terminal rises during an undesired period, thereby preventing malfunction of the shift register. Further, it is possible to reduce the number of required external input signals to be supplied to the shift register.

Since the second output transistor is used to output a shift pulse to be transmitted through the stages, the size of the second output transistor can be made much smaller than that of the first output transistor which is used for output to an outside of the shift register. Accordingly, the drain parasitic capacitor of the second output transistor is sufficiently small as compared with the drain parasitic capacitor and the source parasitic capacitor of the first output transistor and with the first capacitor. Consequently, even if the first clock signal is supplied to the drain of the second output transistor, an influence of pushing up of the electric potential of one end of the first capacitor by capacitive coupling can be ignored.

Further, since load driven by the second output terminal is sufficiently smaller than load driven by the first output terminal, a change amount of a load on an external level shifter which generates a control signal for the shift register can be ignored.

Further, a section which outputs a shift pulse to be supplied to another stage and a reset signal for one end of the first capacitor from the second output transistor via the second output terminal and a section which outputs a reset signal for an output terminal of another stage from the third output transistor via the third output terminal are provided separately from each other so as to drive respective loads. This makes it possible to prevent interference between (i) the shift pulse to be supplied to another stage and the reset signal for one end of the first capacitor and (ii) the reset signal for an output terminal of another stage.

Further, since all of the load connected to the first output terminal, the load connected to the second output terminal, and the load connected to the third output terminal are driven to be boosted by the first capacitor, the second capacitor that is provided between one end of the first capacitor and the second output terminal, and the third capacitor provided between the one end of the first capacitor and the third output terminal, the total capacitance value of the first capacitor, the second capacitor, and the third capacitor can be made equal to or smaller than a value of the first capacitor obtained in a case where the second capacitor and the third capacitor are not provided or can be made equal to or smaller than the total capacitance value of the first capacitor and the second capacitor obtained in a case where the third capacitor is not provided. Accordingly, sizes of the input gate, the first switching element, the second switching element, and the third switching element can be made smaller than those obtained in a case where the second capacitor and the third capacitor are not provided and those obtained in a case where the third capacitor is not provided. Consequently, it is possible to reduce a total area of a circuit using the shift register as compared with a case where the second capacitor and the third capacitor are not provided and a case where the third capacitor is not provided. Further, it is possible to reduce proportion of transistors, especially TFTs to the shift register.

Further, since the area of the circuit using the shift register is reduced, it is possible to reduce a size and a cost of a display panel using the circuit as a driver. The reduction in capacitance value and sizes of elements such as transistors leads to suppression of a reduction in yield caused by detects, thereby contributing to improvement in yield of a display panel and a reduction in cost of the display panel.

Further, since the direct current voltage is applied to the drain of the first output transistor, a gate bus line can be driven by a direct current power supply. This makes it possible to greatly reduce a load on an external level shifter which generates a control signal for the shift register as compared with a case where a clock signal is supplied to the drain of the first output transistor so that a gate bus line is driven by the clock signal.

Further, since the direct current voltage is applied to the drain of the first output transistor, a period of time in which a negative bias is applied between the gate and the drain of the first output transistor is prolonged. This allows a reduction in rise of a threshold voltage, thereby preventing degradation of performance of the shift register.

In order to attain the above object, the shift register of the present invention is arranged such that the first clock signal supplied to an odd-numbered stage of the successive stage group has a phase opposite to a phase of the first clock signal supplied to an even-numbered stage of the successive stage group, and a shift pulse for the first stage of the successive stage group is out of phase by half a period with the first clock signal supplied to the odd-numbered stage.

According to the invention, normal operation of the shift register can be easily accomplished.

In order to attain the above object, the shift register of the present invention is arranged such that the input gate is a seventh switching element having one end to which the first direct current voltage is applied, the other end connected to the one end of the first capacitor, and a conduction/shutoff control terminal to which the shift pulse for said each stage is supplied.

According to the invention, the shift pulse to be supplied to the stage is supplied to one end of the seventh switching element and the conduction/shutoff control terminal. This makes it possible to achieve a state in which leakage to the one end of the first capacitor via the input gate is reduced.

In order to attain the above object, the shift register of the present invention is arranged such that the first output transistor, the second output transistor, the first switching element, the second switching element, the third switching element, the fourth switching element, and the fifth switching element are all TFTs.

According to the invention, since the second capacitor is provided, it is possible to more greatly reduce a size of a shift register.

In order to attain the above object, the shift register of the present invention is arranged such that the first output transistor, the second output transistor, the third output transistor, the first switching element, the second switching element, the third switching element, the fourth switching element, the fifth switching element, and the sixth switching element are all TFTs.

According to the invention, since the second capacitor and the third capacitor are provided, it is possible to more greatly reduce a size of a shift register.

In order to attain the above object, the shift register of the present invention is arranged such that the seventh switching element is a TFT.

According to the invention, since an additional capacitor is provided, it is possible to more greatly reduce a size of a shift register.

In order to attain the above object, a display device of the present invention includes the shift register.

According to the invention, it is possible to provide a display device which can suppress noise of each stage output well without causing an increase in circuit scale.

The present invention is not limited to the description of the embodiments above, but may be altered by a skilled person within the scope of the claims. An embodiment based on a proper combination of technical means disclosed in different embodiments is encompassed in the technical scope of the present invention.

Industrial Applicability

The present invention is suitably applicable to an active matrix type display device.

Reference Signs List

C1: Capacitor (first capacitor)
C2: Capacitor (second capacitor)
C3: Capacitor (third capacitor)
M1: Transistor (input gate, seventh switching element)
M2: Transistor (first switching element)
M3: Transistor (second switching element)
M4: Transistor (third switching element)
M5: Transistor (first output transistor)
M6: Transistor (fourth switching element)
M7: Transistor (second output transistor)
M8: Transistor (fifth switching element)
M9: Transistor (third output transistor)
M10: Transistor (sixth switching element)
OUT: Terminal (output terminal, first output terminal)
Z: Terminal (output terminal, second output terminal)
Z1: Terminal (output terminal, second output terminal)
Z2: Terminal (output terminal, third output terminal)
VDD: Power supply voltage (first direct current voltage)
VSS: Power supply voltage (second direct current voltage)
Xi: Stage
CK1: Clock signal (first clock signal of an odd-numbered stage)
CK2: Clock signal (first clock signal of an even-numbered stage)

The invention claimed is:

1. A shift register comprising
one or more cascade connection circuits in each of which stages are cascaded with each other so that a shift pulse is transmitted,
at least one of the one or more cascade connection circuits including, among all stages thereof, a successive stage group constituted by successive stages,
each stage of the successive stage group including:

a first output transistor having a drain to which a first direct current voltage is applied and a source serving as a first output terminal which is an output terminal of said each stage;

a second output transistor having (i) a drain to which a first clock signal corresponding to said each stage is supplied, the first clock signal having an active clock pulse period which does not overlap a period of a shift pulse for said each stage, and (ii) a source serving as a second output terminal which is an output terminal of said each stage and which is different from the first output terminal;

a first capacitor having one end connected to a gate of the first output transistor and a gate of the second output transistor;

a second capacitor having one end connected to the one end of the first capacitor and other end connected to the second output terminal;

an input gate to which the shift pulse for said each stage is supplied and through which an electric potential to be supplied to the one end of the first capacitor passes during a pulse period of the shift pulse for said each stage;

a first switching element having one end connected to the other end of the first capacitor, the other end to which the first direct current voltage is applied, and a conduction/shutoff control terminal to which the first clock signal is supplied;

a second switching element having one end connected to the other end of the first capacitor, the other end to which a second direct current voltage lower than the first direct current voltage is applied, and a conduction/shutoff control terminal to which the shift pulse for said each stage is supplied;

a third switching element having one end connected to the one end of the first capacitor, the other end to which the second direct current voltage is applied, and a conduction/shutoff control terminal to which a pulse signal whose phase lags behind a phase of a shift pulse outputted from the second output terminal of said each stage is supplied;

a fourth switching element having one end connected to the first output terminal, the other end to which the second direct current voltage is applied, and a conduction/shutoff control terminal (i) to which, in a case where said each stage is not a final stage of the successive stage group, a shift pulse outputted from the second output terminal of a succeeding stage is supplied and (ii) to which, in a case where said each stage is the final stage of the successive stage group, a pulse signal whose phase lags behind a phase of a shift pulse outputted from the second output terminal of the final stage is supplied; and a fifth switching element having one end connected to the second output terminal, the other end to which the second direct current voltage is applied, and a conduction/shutoff control terminal connected to the conduction/shutoff control terminal of the fourth switching element.

2. The shift register according to claim 1, wherein:
the first clock signal supplied to an odd-numbered stage of the successive stage group has a phase opposite to a phase of the first clock signal supplied to an even-numbered stage of the successive stage group, and
a shift pulse for the first stage of the successive stage group is out of phase by half a period with the first clock signal supplied to the odd-numbered stage.

3. The shift register according to claim 1, wherein:
the input gate is a seventh switching element having one end to which the first direct current voltage is applied, the other end connected to the one end of the first capacitor, and a conduction/shutoff control terminal to which the shift pulse for said each stage is supplied.

4. The shift register according to claim 3, wherein:
the seventh switching element is a TFT.

5. The shift register according to claim 1, wherein:
the first output transistor, the second output transistor, the first switching element, the second switching element, the third switching element, the fourth switching element, and the fifth switching element are all TFTs.

6. A display device comprising a shift register as set forth in claim 1.

7. A shift register comprising
one or more cascade connection circuits in each of which stages are cascaded with each other so that a shift pulse is transmitted,
at least one of the one or more cascade connection circuits including, among all stages thereof, a successive stage group constituted by successive stages,
each stage of the successive stage group including:
a first output transistor having a drain to which a first direct current voltage is applied and a source serving as a first output terminal which is an output terminal of said each stage;

a second output transistor having (i) a drain to which a first clock signal corresponding to said each stage is supplied, the first clock signal having an active clock pulse period which does not overlap a period of a shift pulse for said each stage, and (ii) a source serving as a second output terminal which is an output terminal of said each stage and which is different from the first output terminal;

a third output transistor having a drain to which the first clock signal is supplied and a source serving as a third output terminal which is an output terminal of said each stage and which is different from the first output terminal and the second output terminal;

a first capacitor having one end connected to a gate of the first output transistor, a gate of the second output transistor, and a gate of the third output transistor;

a second capacitor having one end connected to the one end of the first capacitor and other end connected to the second output terminal;

a third capacitor having one end connected to the one end of the first capacitor and having the other end connected to the third output terminal;

an input gate to which the shift pulse for said each stage is supplied and through which an electric potential to be supplied to the one end of the first capacitor passes during a pulse period of the shift pulse for said each stage;

a first switching element having one end connected to the other end of the first capacitor, the other end to which the first direct current voltage is applied, and a conduction/shutoff control terminal to which the first clock signal is supplied;

a second switching element having one end connected to the other end of the first capacitor, the other end to which a second direct current voltage lower than the first direct current voltage is applied, and a conduction/shutoff control terminal to which the shift pulse for said each stage is supplied;

a third switching element having one end connected to the one end of the first capacitor, the other end to which the second direct current voltage is applied, and a conduction/shutoff control terminal to which a first pulse signal whose phase lags behind a phase of a shift pulse outputted from the second output terminal of said each stage is supplied;

a fourth switching element having one end connected to the first output terminal, the other end to which the second direct current voltage is applied, and a conduction/shutoff control terminal to which a second pulse signal whose phase lags behind the phase of the shift pulse outputted from the second output terminal of said each stage is supplied; and a fifth switching element having one end connected to the second output terminal, the other end to which the second direct current voltage is applied, and a conduction/shutoff control terminal connected to the conduction/shutoff control terminal of the fourth switching element; and a sixth switching element having one end connected to the third output terminal, the other end to which the second direct current voltage is applied, and a conduction/shutoff control terminal connected to the conduction/shutoff control terminal of the fourth switching element, a signal outputted from the second output terminal of each of the stages of the successive stage group except a first stage being used as a shift pulse and the first pulse signal for a preceding stage, and a signal outputted from the third output terminal of each of the stages of the successive stage group except the first stage being used as the second pulse signal for the preceding stage.

8. The shift register according to claim 7, wherein:

the first output transistor, the second output transistor, the third output transistor, the first switching element, the second switching element, the third switching element, the fourth switching element, the fifth switching element, and the sixth switching element are all TFTs.

* * * * *